US011315936B2

(12) United States Patent
Chang et al.

(10) Patent No.: US 11,315,936 B2
(45) Date of Patent: Apr. 26, 2022

(54) MEMORY DEVICE AND MANUFACTURING METHOD THEREOF

(71) Applicant: Taiwan Semiconductor Manufacturing Co., Ltd., Hsinchu (TW)

(72) Inventors: Meng-Sheng Chang, Hsinchu County (TW); Chia-En Huang, Hsinchu County (TW); Yi-Hsun Chiu, Hsinchu County (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/805,868

(22) Filed: Mar. 2, 2020

(65) Prior Publication Data
US 2021/0066319 A1 Mar. 4, 2021

Related U.S. Application Data

(60) Provisional application No. 62/893,193, filed on Aug. 29, 2019.

(51) Int. Cl.
| H01L 29/66 | (2006.01) |
| H01L 21/84 | (2006.01) |
| H01L 27/112 | (2006.01) |
| H01L 23/525 | (2006.01) |

(52) U.S. Cl.
CPC .... *H01L 27/11206* (2013.01); *H01L 23/5252* (2013.01)

(58) Field of Classification Search
CPC .............. H01L 23/5252; H01L 27/11206
USPC .............. 257/343; 438/156, 192, 282
See application file for complete search history.

(56) References Cited

U.S. PATENT DOCUMENTS

| 7,696,046 | B2* | 4/2010 | Kim ................ H01L 29/66787 438/270 |
| 8,084,308 | B2* | 12/2011 | Chang .............. H01L 29/78696 438/151 |
| 8,669,144 | B2* | 3/2014 | Tang ................... H01L 21/768 438/128 |
| 9,209,247 | B2 | 12/2015 | Colinge et al. |
| 9,236,267 | B2 | 1/2016 | De et al. |
| 9,318,552 | B2* | 4/2016 | Xie .................. H01L 29/42392 |
| 9,412,817 | B2 | 8/2016 | Yang et al. |
| 9,412,828 | B2 | 8/2016 | Ching et al. |
| 9,472,618 | B2 | 10/2016 | Oxland |
| 9,484,447 | B2* | 11/2016 | Kim ..................... H01L 29/78 |

(Continued)

*Primary Examiner* — Calvin Lee
(74) *Attorney, Agent, or Firm* — JCIPRNET

(57) ABSTRACT

A memory device and a manufacturing method thereof are provided. The memory device includes a transistor, a first embedded insulating structure and a second embedded insulating structure. The transistor is formed on a substrate, and includes a gate structure, channel structures, a source electrode and a drain electrode. The channel structures penetrate through the gate structure, and are in contact with the source and drain electrodes. The first and second embedded insulating structures are disposed in the substrate, and overlapped with the source and drain electrodes. The first and second embedded insulating structures are laterally spaced apart from each other by a portion of the substrate lying under the gate structure.

20 Claims, 31 Drawing Sheets

(56) References Cited

U.S. PATENT DOCUMENTS

| | | |
|---|---|---|
| 9,502,265 B1 | 11/2016 | Jiang et al. |
| 9,520,482 B1 | 12/2016 | Chang et al. |
| 9,536,738 B2 | 1/2017 | Huang et al. |
| 9,570,609 B2 * | 2/2017 | Obradovic ........ H01L 29/78681 |
| 9,576,814 B2 | 2/2017 | Wu et al. |
| 9,608,116 B2 | 3/2017 | Ching et al. |
| 10,177,226 B2 * | 1/2019 | Guillorn ........... H01L 29/78654 |
| 10,192,615 B2 * | 1/2019 | Chung ................ H01L 27/2409 |
| 10,692,873 B2 * | 6/2020 | Ando ................ H01L 29/42392 |

* cited by examiner

MEMORY DEVICE AND MANUFACTURING METHOD THEREOF

CROSS-REFERENCE TO RELATED APPLICATION

This application claims the priority benefit of U.S. provisional application Ser. No. 62/893,193, filed on Aug. 29, 2019. The entirety of the above-mentioned patent application is hereby incorporated by reference herein and made a part of this specification.

BACKGROUND

One-time-programmable (OTP) memory is a type of non-volatile memory (NVM) in which data can be written only once. Once OTP memory is programmed, the written data is retained even when power is removed. OTP memory is used in applications where reliable and repeatable reading of data is required. Examples include boot code, encryption keys and configuration parameters for analog circuitry, sensor circuitry or display circuitry. Regarding operation of OTP memory, a high voltage is required for programming OTP memory. Since OTP memory with a lower programming voltage can be more compatible with other integrated circuits, methods to lower the programming voltage is one of the important objects in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
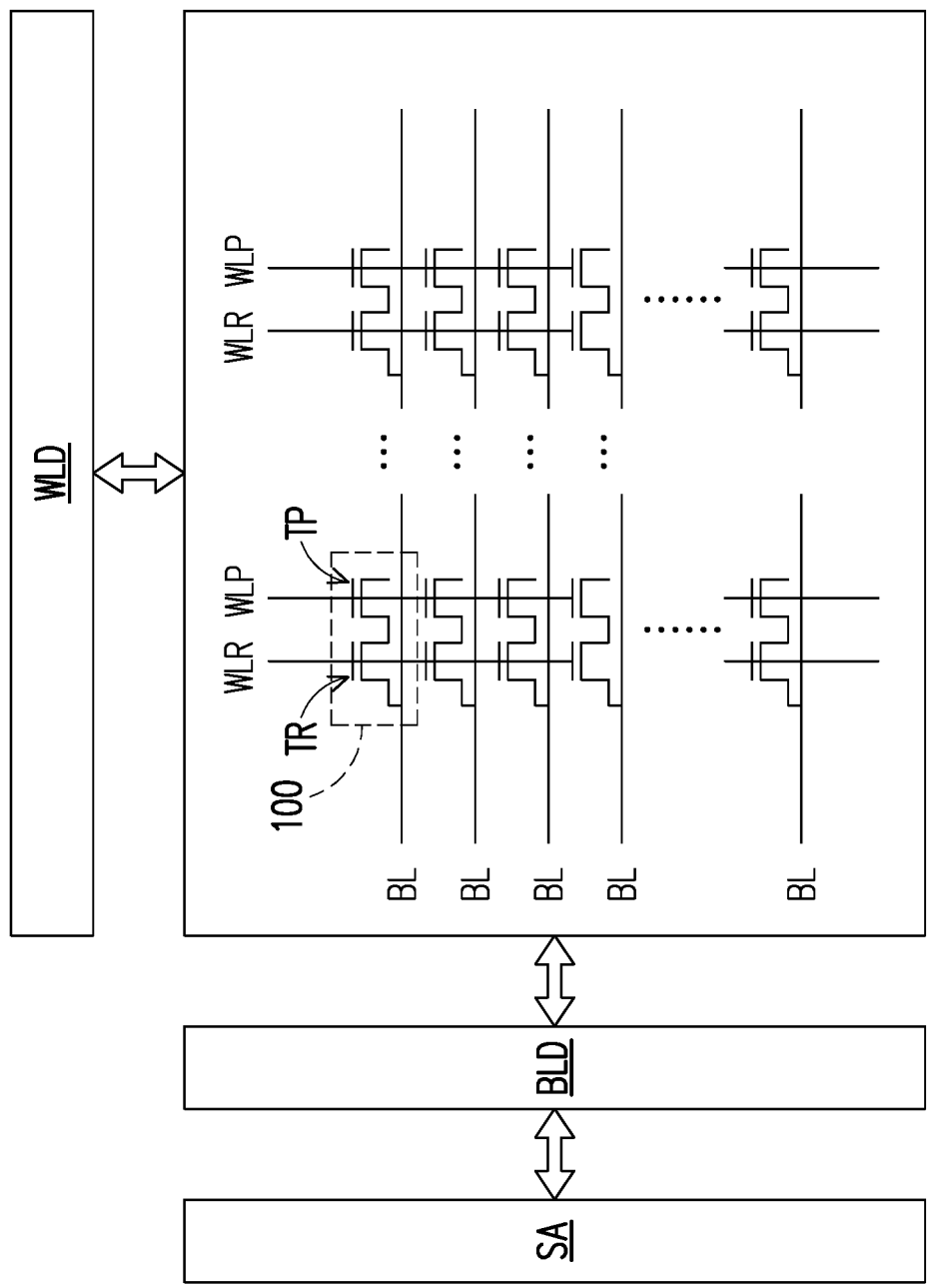
FIG. 1 is a block diagram illustrating a memory device having antifuse cells according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 2A:
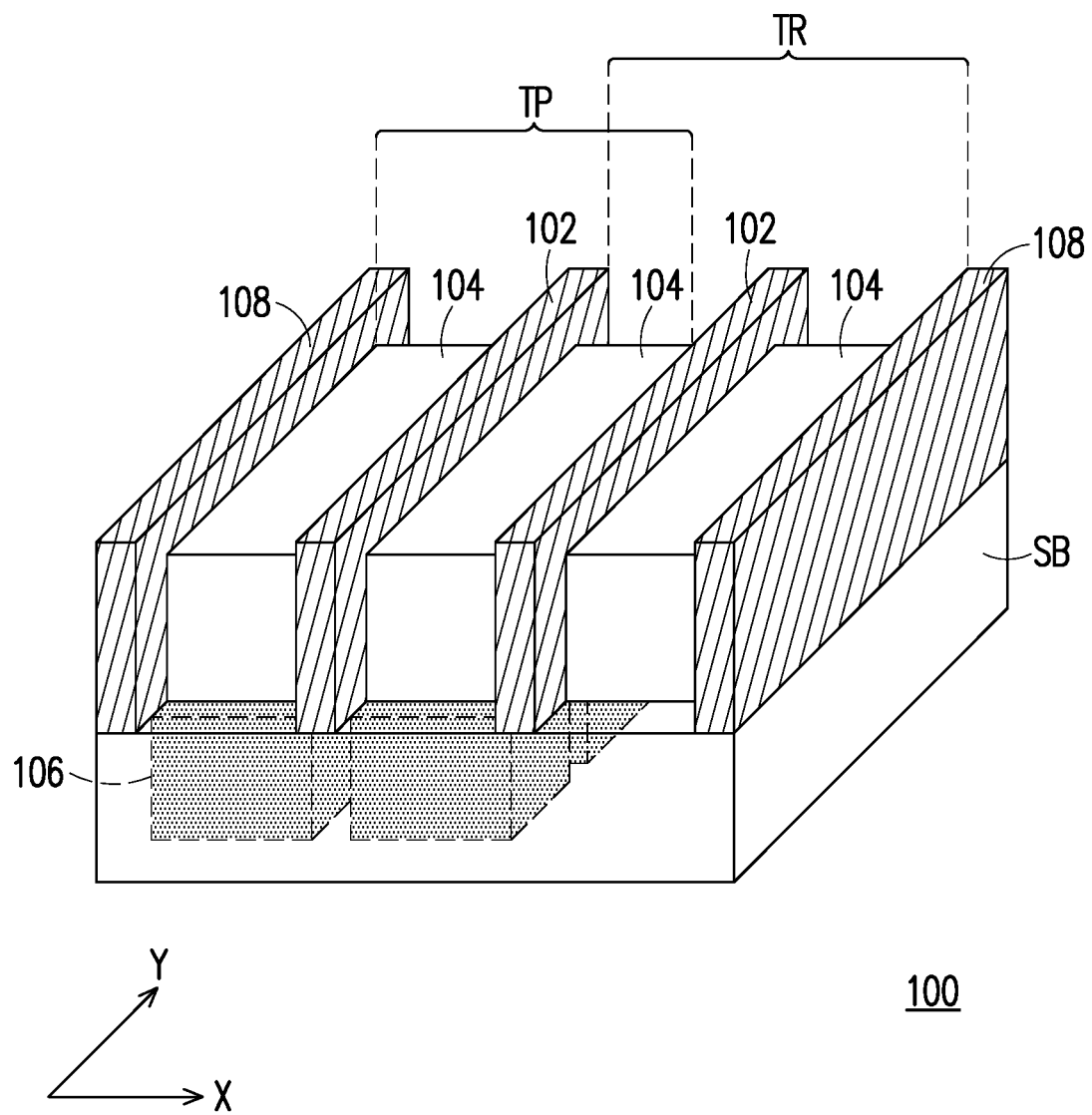
FIG. 2A is a schematic three-dimensional view illustrating one of the antifuse cells shown in FIG. 1.

FIG. 1 is a block diagram illustrating a memory device 10 having antifuse cells 100 according to some embodiments of the present disclosure. FIG. 2A is a schematic three-dimensional view illustrating one of the antifuse cells 100 shown in FIG. 1.

Referring to FIG. 1, the memory device 10 includes a plurality of the antifuse cells 100. In some embodiments, each of the antifuse cells 100 includes a read transistor TR and a program transistor TP. The read transistor TR and the program transistor TP are connected together by a shared source/drain electrode, and electrically coupled to a bit line BL. In addition, the gate electrodes of the read transistor TR and the program transistor TP are electrically coupled to a read word line WLR and a program word line WLP, respectively. Gate dielectric breakdown may be utilized as a one-time programming mechanism, and can be achieved by applying a high voltage to the program word line WLP. Before the gate dielectric breakdown of the program transistor TP, a region between gate and source/drain electrodes of the program transistor TP behaves like a capacitor, and the program transistor TP can be regarded as being in a high resistance state (i.e., having a logic data "1"). When the program word line WLP receives a high voltage, the gate dielectric breakdown may occur in the program transistor TP, and a conductive path penetrating through the gate dielectric of the program transistor TP may be formed. In this way, the region between the gate and source/drain electrodes of the program transistor TP behaves like a resistor, and the program transistor TP can be regarded as being in a low resistance state (i.e., having a logic data "0"). Since the gate dielectric breakdown is irrecoverable, the program transistor TP is functioned as an OTP device. On the other hand, during a read operation, by turning on the read transistor TR and applying a voltage difference between the program word line WLP and the bit line BL, the resistance state of the program transistor TP can be detected. In some embodiments, the antifuse cells 100 are arranged in an array, which has multiple rows and multiple columns. A column of the antifuse cells 100 may share one of the read word lines WLR and one of the program word lines WLP, and may be each electrically coupled to one of the bit lines BL. In addition, each bit line BL is shared by a row of the antifuse cells 100. In some embodiments, the read word lines WLR and the program word lines WLP are controlled by a word line driver WLD, whereas the bit lines BL are controlled by a bit line driver BLD, and the read out of the resistance states of the antifuse cells 100 can be facilitated by a sense amplifier SA electrically coupled to the bit line driver BLD.

Referring to FIG. 1 and FIG. 2A, one of the antifuse cells 100 shown in FIG. 1 is depicted in FIG. 2A. The program transistor TP and the read transistor TR of the antifuse cell 100 respectively include a gate structure 102 and a pair of source/drain electrodes 104 located at opposite sides of the gate structure 102. The gate structures 102 and the source/drain electrodes 104 are arranged along a first direction X, and are extending along a second direction Y intersected with the first direction X (e.g., perpendicular to the first direction X). One of the gate structures 102 is a portion of the read word line WLR as shown in FIG. 1, and the other one of the gate structures 102 is a portion of the program word line WLP as shown in FIG. 1. In addition, one of the source/drain electrodes 104 located between the gate structures 102 is shared by the program transistor TP and the read transistor TR. In some embodiments, the gate structures 102 and the source/drain electrodes 104 are formed over a substrate SB, such as a semiconductor wafer or a semiconductor-on-insulator (SOI) wafer. In addition, the program transistor TP further includes at least one embedded insulating structure 106. The at least one embedded insulating structure 106 is/are formed in the substrate SB, and extend(s) into the substrate SB from a top surface of the substrate SB. In some embodiments, as shown in FIG. 2A, the program transistor TP includes a plurality of the embedded insulating structures 106, which are laterally separated from one another, and are arranged as two columns extending along the second direction Y and located at opposite sides of the gate structure 102 of the program transistor TP. The two columns of the embedded insulating structures 106 are overlapped with the source/drain electrodes 104, respectively. In addition, the embedded insulating structures 106 may or may not further extend to a region lying under a peripheral portion of the gate structure 102 of the program transistor TP, but the two columns of the embedded insulating structures 106 are laterally spaced apart from each other by a portion of the substrate SB. That is, the gate structure 102 of the program transistor TP may not be entirely overlapped with the embedded insulating structures 106, and each of the embedded insulating structures 106 may not extend across opposite sides of the gate structure 102. In some embodiments, as shown in FIG. 2A, some sidewalls of the embedded insulating structures 106 are substantially coplanar with opposite sidewalls of the gate structure 102 of the program transistor TP. On the other hand, the embedded insulating structures 106 may not be overlapped with both source/drain electrodes 104 of the read transistor TR. For instance, as shown in FIG. 2A, one of the source/drain electrodes 104 of the read transistor TR is overlapped with some of the embedded insulating structures 106, whereas the other source/drain electrode 104 of the read transistor TR is not overlapped with any of the embedded insulating structures 106. In addition, the embedded insulating structures 106 lying under the shared source/drain electrode 104 may or may not further extend to a region lying under a peripheral portion of the gate structure 102 of the read transistor TR, but the gate structure 102 of the read transistor TR may not be entirely overlapped with these embedded insulating structures 106, and each embedded insulating structure 106 may not extend across opposite sides of the gate structure 102. In some embodiments, as shown in FIG. 2A, some sidewalls of the embedded insulating structures 106 lying under the shared source/drain electrode 104 are substantially coplanar with a sidewall of the gate structure 102 of the read transistor TR.

By disposing the embedded insulating structures 106, a leakage path along which accidentally formed gate leakage out spreading from below the gate structure 102 of the program transistor TP can be cut off. Therefore, during a programming operation, the accidentally formed gate leakages of the unselected program transistors TP electrically coupled to the same program word line WLP (as shown in FIG. 1) can be avoided from summing up to form a large leakage current. Such large leakage current may result in significant voltage drop along the program word line WLP, and additional pumping circuit may be required to raise the program voltage applied to the program word line WLP, in order to ensure that the gate dielectric breakdown would occur in the selected program transistor TP. In other words, as a result of disposing the embedded insulating structures 106, the memory device 10 can be programmed by a relatively low program voltage, and a pumping circuit configured to raise the program voltage may not be required in the memory device 10. Therefore, the memory device 10 with the embedded insulating structures 106 can be more compatible with other integrated circuits. Moreover, since the embedded insulating structures 106 are not lying under both of the source/drain electrodes 104 of the read transistor TR, operation speed of the read transistor TR can be less influenced by the parasitic capacitance resulted from the embedded insulating structures 106.

In some embodiments, the antifuse cell 100 further includes dummy gate structures 108 (e.g., two dummy gate structures 108). The dummy gate structures 108 are disposed on the substrate SB. In addition, the dummy gate structures 108 extend along the second direction Y, and the gate structures 102 are arranged between the dummy gate structures 108. A column of the embedded insulating structures 106 may be located between the gate structure 102 of the program transistor TP and one of the dummy gate structures 108. In addition, this column of the embedded insulating structures 106 may or may not further extend to a region lying under the dummy gate structure 108, but would not be overlapped with the entire dummy gate structure 108, and may not extend across opposite sides of the dummy gate structure 108. The dummy gate structures 108 may be electrically floated, or receive a voltage that could not turn on the parasitic transistors each formed of one of the dummy gate structures 108 and a portion of the substrate SB lying under the dummy gate structure 108. In this way, the interference between adjacent antifuse cells 100 can be reduced.

Figure 2B:
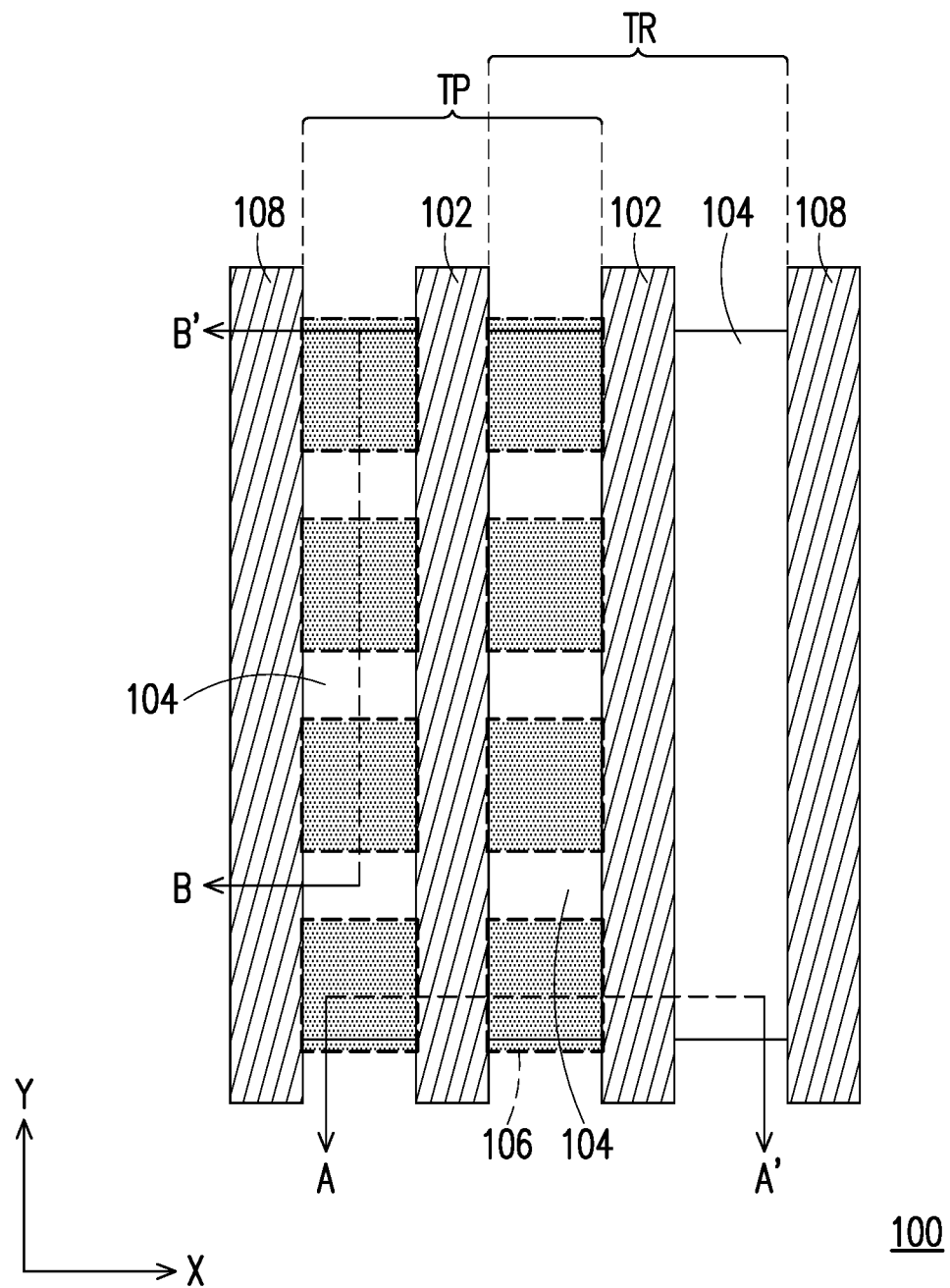
FIG. 2B is a schematic top view illustrating the antifuse cell as shown in FIG. 2A.
Figure 2C:
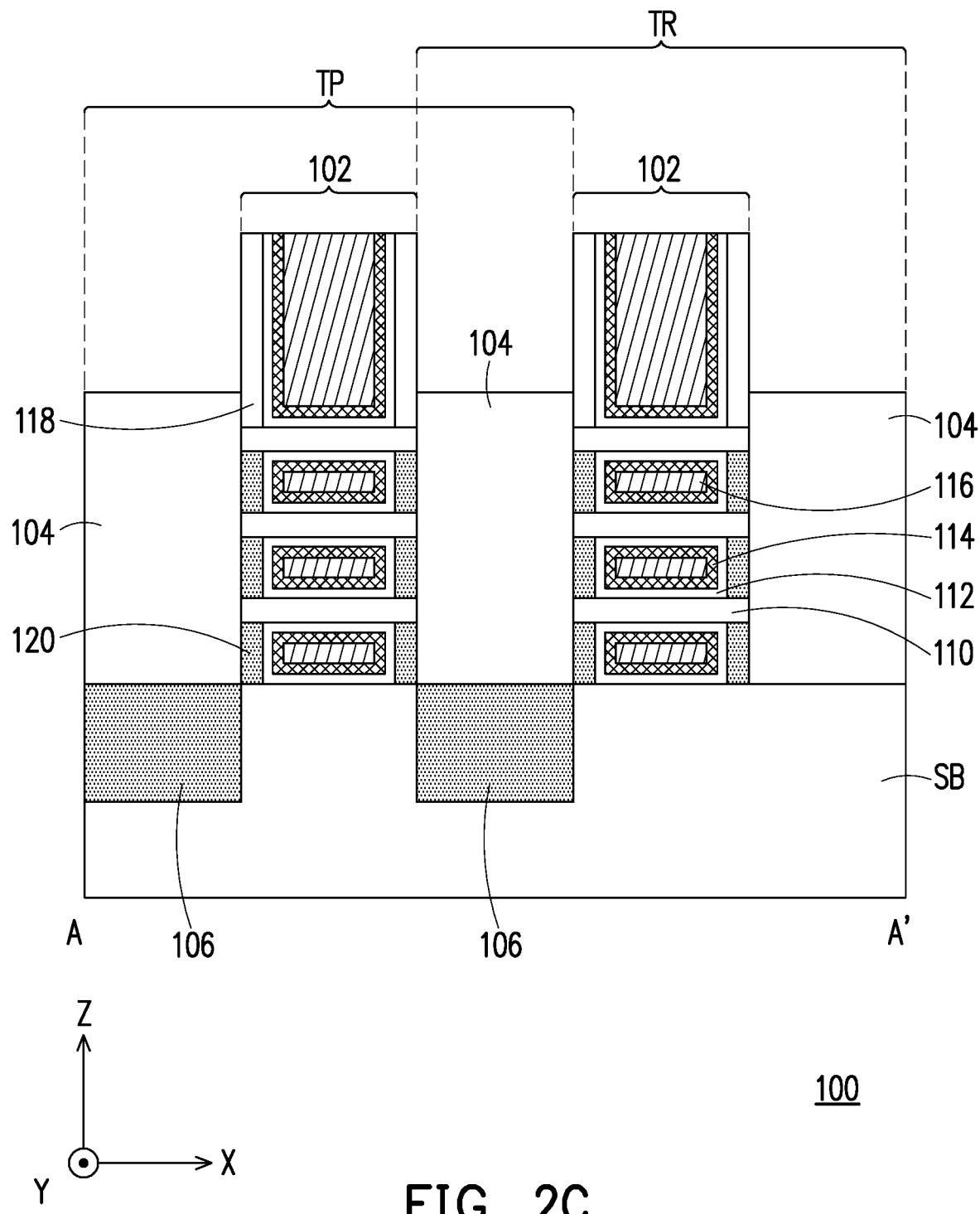
FIG. 2C is a schematic cross-sectional view along the line A-A' shown in FIG. 2B.
Figure 2D:
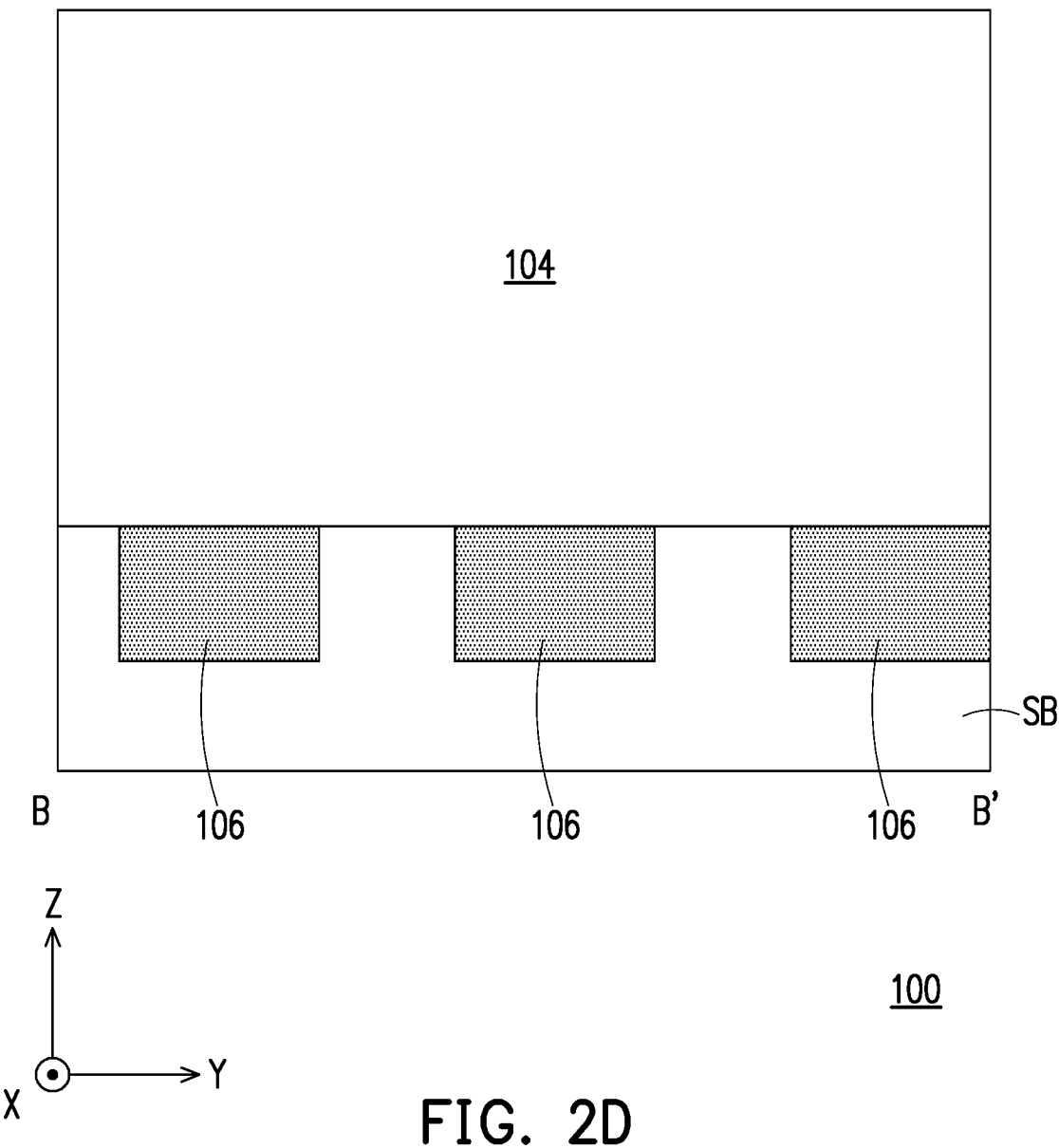
FIG. 2D is a schematic cross-sectional view along the line B-B' shown in FIG. 2B.

FIG. 2B is a schematic top view illustrating the antifuse cell 100 as shown in FIG. 2A. FIG. 2C is a schematic cross-sectional view along the line A-A' shown in FIG. 2B. FIG. 2D is a schematic cross-sectional view along the line B-B' shown in FIG. 2B.

As shown in FIG. 2B, in some embodiments, the embedded insulating structures 106 are separately arranged at opposite sides of the gate structure 102 of the program transistor TP, and are overlapped with the source/drain electrodes 104 of the program transistor TP. A column of the embedded insulating structures 106 are located between the gate structure 102 of the program transistor TP and one of the dummy gate structures 108, whereas another column of the embedded insulating structures 106 are located between the gate structures 102 of the program transistor TP and the read transistor TR. In addition, portions of the source/drain electrodes 104 overlapped with the embedded insulating structures 106 spread from near ends of the source/drain electrodes 104 (facing toward the gate structure 102 of the program transistor TP) to far ends of the source/drain electrodes 104 (facing away from the gate structure 102 of the program transistor TP).

As shown in FIG. 2C, in some embodiments, the read transistors TR and the program transistors TP are gate-all-around (GAA) field effect transistors (FETs). In these embodiments, the read transistor TR and the program transistor TP respectively include channel structures 110, and the gate structures 102 respectively include a gate dielectric layer 112, a work function layer 114, a conductive material 116, gate spacers 118 and inner spacers 120. The channel structures 110 may be semiconductor sheets. The channel structures 110 penetrate through the gate structure 102 along the first direction X, and are in contact with the source/drain electrodes 104 located at opposite sides of the gate structure 102. The channel structures 110 may be divided into multiple groups. Although not shown, these groups of channel structures 110 are separately arranged along the second direction Y. As shown in FIG. 2C, each group includes more than one of the channel structures 110, and the channel structures 110 in each group are separately arranged along a vertical direction Z. Two of the inner spacers 120 stand between vertically adjacent channel structures 110 or between the bottommost channel structure 110 and the substrate SB, and are laterally spaced apart from each other. Outer sidewalls of the inner spacers 120 define a portion of opposite sidewalls of the gate structure 102, and are in contact with the source/drain electrodes 104 located at opposite sides of the gate structure 102. Some portions of the gate spacers 118 are located on the topmost channel structure 110, and are spaced apart from each other. Outer sidewalls of the gate spacers 118 define another portion of the opposite sidewalls of the channel structures 110, and may or may not be in contact with the source/drain electrodes 104 located at opposite sides of the gate structure 102. Space defined between the gate spacers 118, the channel structures 110 and the inner spacers 120 is filled by the gate dielectric layer 112, the work function layer 114 and the conductive material 116. The channel structures 110 are wrapped by the gate dielectric layer 112. In addition, the gate dielectric layer 112 may further cover the substrate SB and inner sidewalls of the gate spacers 118 and the inner spacers 120. The work function layer 114 covers the gate dielectric layer 112, and the remainder portion of the above-mentioned space in the gate structure 102 is filled by the conductive material 116. The conductive material 116 and the work function layer 114 may be collectively functioned as a gate electrode. When the transistor (i.e., the read transistor TR or the program transistor TP) is turned on by applying a proper voltage to the gate electrode, charges may be induced in the channel structures 110, and a conductive path may be formed between the source/drain electrodes 104 located at opposite sides of the gate structure 102. During a programming operation of the antifuse cell 100, the gate electrode of the program transistor TP may receive a high voltage, which may lead to breakdown of portions of the gate dielectric layer 112 located between the channel structures 110 and the gate electrode, such that a logic data "1" can be written into the antifuse cell 100.

Although not shown, the antifuse cell 100 may further include additional channel structures penetrating through the dummy gate structures 108 (as shown in FIG. 2B). In addition, additional gate dielectric layer, work function layer, conductive material, inner spacers and gate spacers may be formed to wrap the additional channel structures. The dummy gate structures 108 are structurally similar to the gate structures 102, and relevant description thereof is not reiterated herein. Furthermore, in alternative embodiments, the read transistor TR and the program transistor are fin-type FETs (finFETs). In these alternative embodiments, each group of the channel structures 110 as shown in FIG. 2C may be replaced by a semiconductor fin structure, and a top surface and opposite sidewalls of such semiconductor fin structure are covered by the gate dielectric layer, the work function layer and the conductive material.

As shown in FIG. 2D, in some embodiments, a column of the embedded insulating structures 106 are separately arranged along the second direction Y, and are overlapped with one of the source/drain electrodes 104. Those skilled in the art may adjust dimensions, shapes of the embedded insulating structures 106 and spacing between adjacent embedded insulating structures 106 according to design requirements, the present disclosure is not limited thereto.

FIG. 3A through FIG. 3E are top views illustrating antifuse cells 100a, 100b, 100c, 100d and 100e according to other embodiments of the present disclosure. The antifuse cells 100a-100e as shown in FIG. 3A through FIG. 3E are similar to the antifuse cell 100 as shown in FIG. 2A through FIG. 2D. Only the difference therebetween will be described, the same or the like parts would not be repeated again.

Figure 3A:
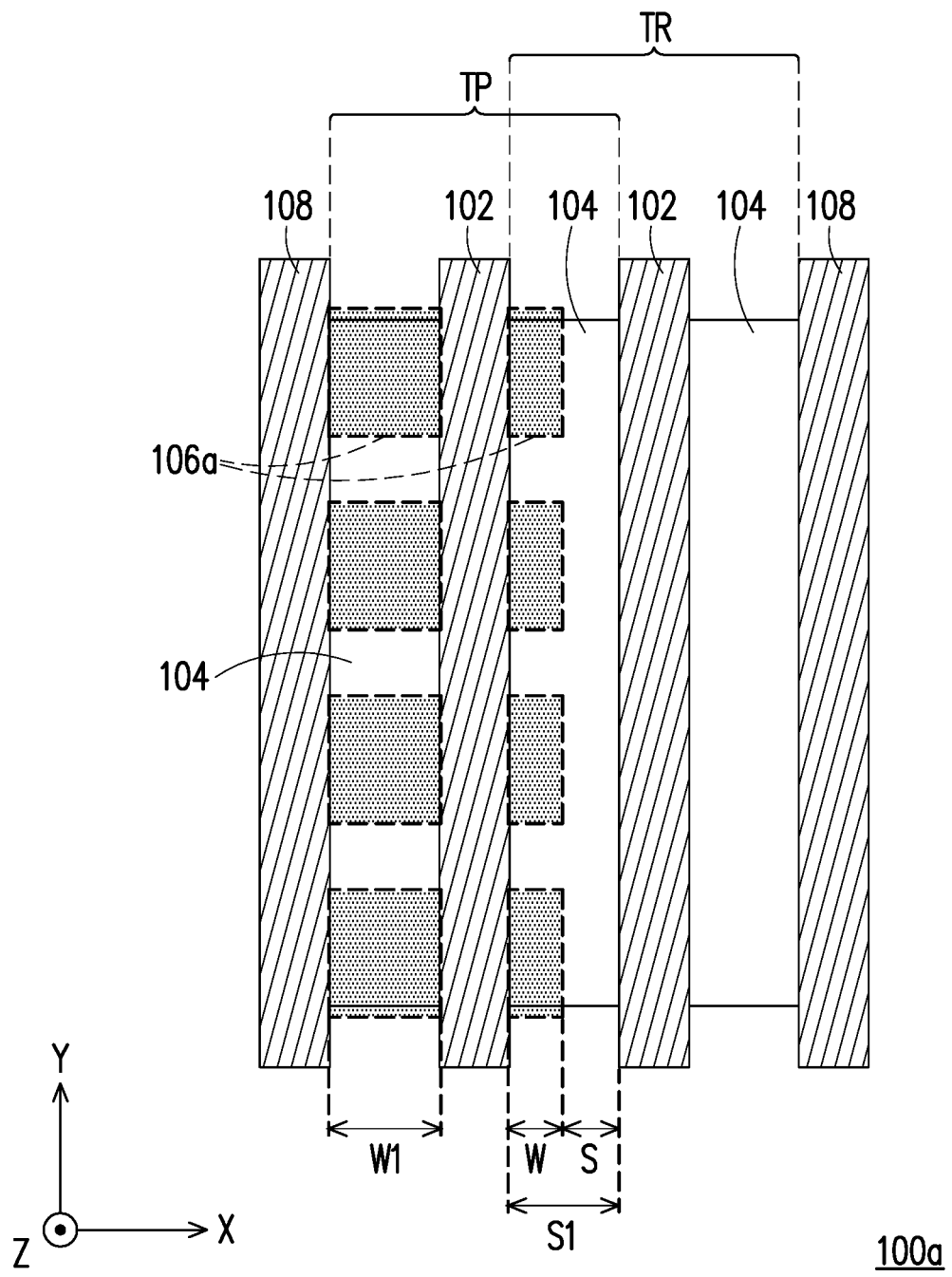
FIG. 3A through FIG. 3E are top vies illustrating antifuse cells according to some embodiments of the present disclosure.

Referring to FIG. 3A, in some embodiments, portions of one of the source/drain electrodes 104 overlapped with some embedded insulating structures 106a are not reaching to the far end of this source/drain electrode 104 (facing away from the gate structure 102 of the program transistor TP). That is, a portion of this source/drain electrode 104 away from the gate structure 102 of the program transistor TP is not overlapped with any of the embedded insulating structures 106a. For instance, portions of the shared source/drain electrode 104 overlapped with some embedded insulating structures 106a are not reaching to the far end of this shared source/drain electrode 104, and a portion of the shared source/drain electrode 104 away from the gate structure 102 of the program transistor TP is not overlapped with the embedded insulating structures 106a. Thus, these embedded insulating structures 106a are laterally spaced apart from the gate structure 102 of the read transistor TR. These embedded insulating structures 106a may have a width W smaller than a width W1 of other embedded insulating structures 106a overlapped with the source/drain electrode 104 located between the gate structure 102 of the program transistor TP and one of the dummy gate structures 108. In addition, a non-zero lateral spacing S may be in between the gate structure 102 of the read transistor TR and the closest embedded insulating structures 106a, and the lateral spacing S is shorter than a lateral spacing S1 between adjacent gate structures 102. By having a non-zero lateral spacing S between the gate structure 102 of the read transistor TR and the closest embedded insulating structures 106a, the read transistor TR may be less influenced by the parasitic capacitance resulted from these embedded insulating structures 106a, and operation speed of the read transistor TR may be improved.

Figure 3B:
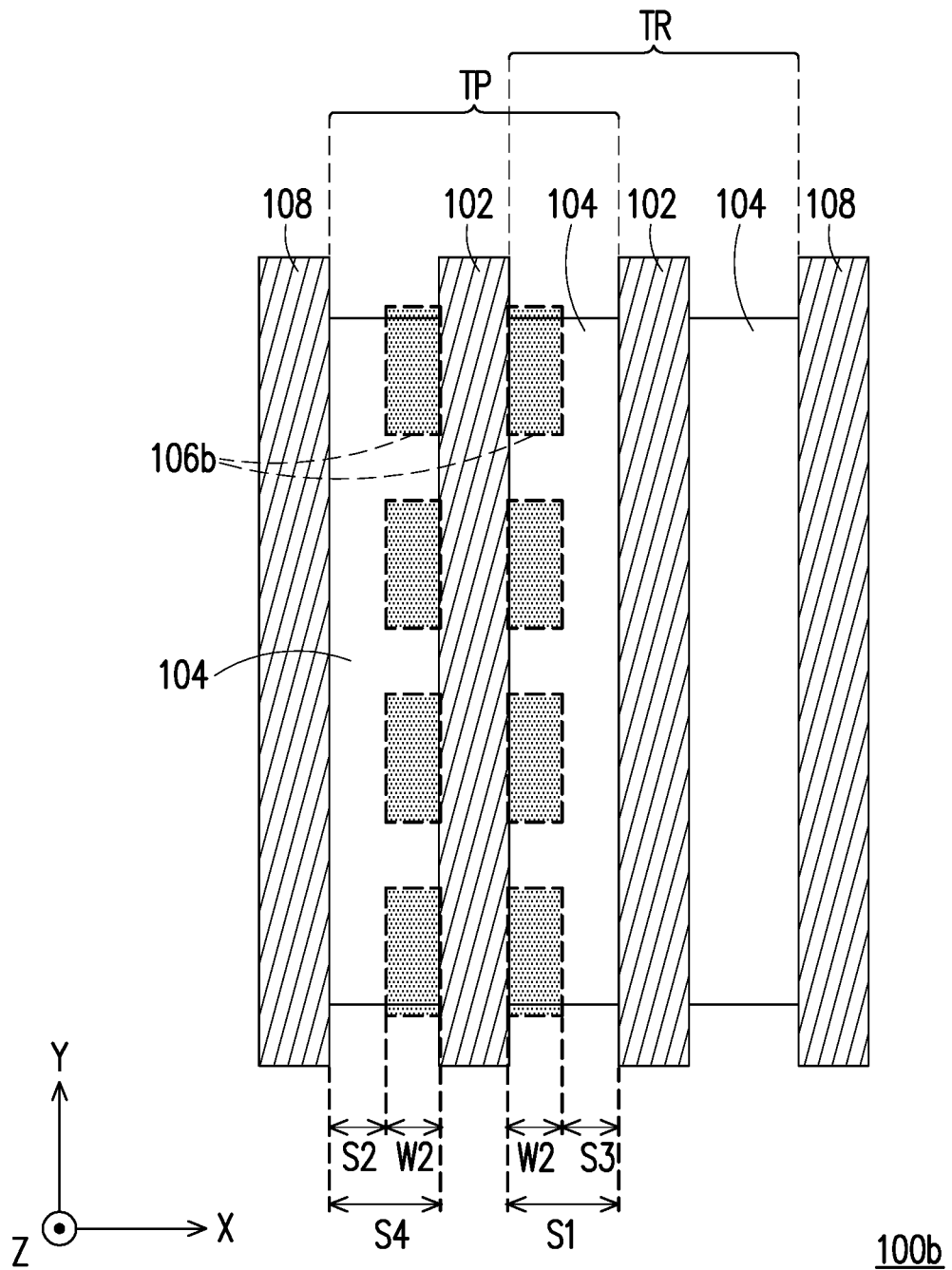

Referring to FIG. 3B, portions of both source/drain electrodes 104 of the program transistor TP overlapped with embedded insulating structures 106b are not reaching to the far ends of the source/drain electrodes 104 (facing away from the gate structure 102 of the program transistor TP). That is, portions of these source/drain electrodes 104 away from the gate structure 102 of the program transistor TP are not overlapped with any of the embedded insulating structures 106b. In this way, a column of the embedded insulating structures 106b located between the gate structure 102 and one of the dummy gate structures 108 are laterally spaced apart from the dummy gate structure 108 by a non-zero lateral spacing S2, and another column of the embedded insulating structures 106b are laterally spaced apart from the gate structure 102 of the read transistor TR by a non-zero lateral spacing S3. In addition, the embedded insulating structures 106b may respectively have a width W2 smaller than the spacing S1 between the adjacent gate structures 102 and a spacing S4 between the gate structure 102 of the program transistor TP and the closest dummy gate structure 108.

Figure 3C:
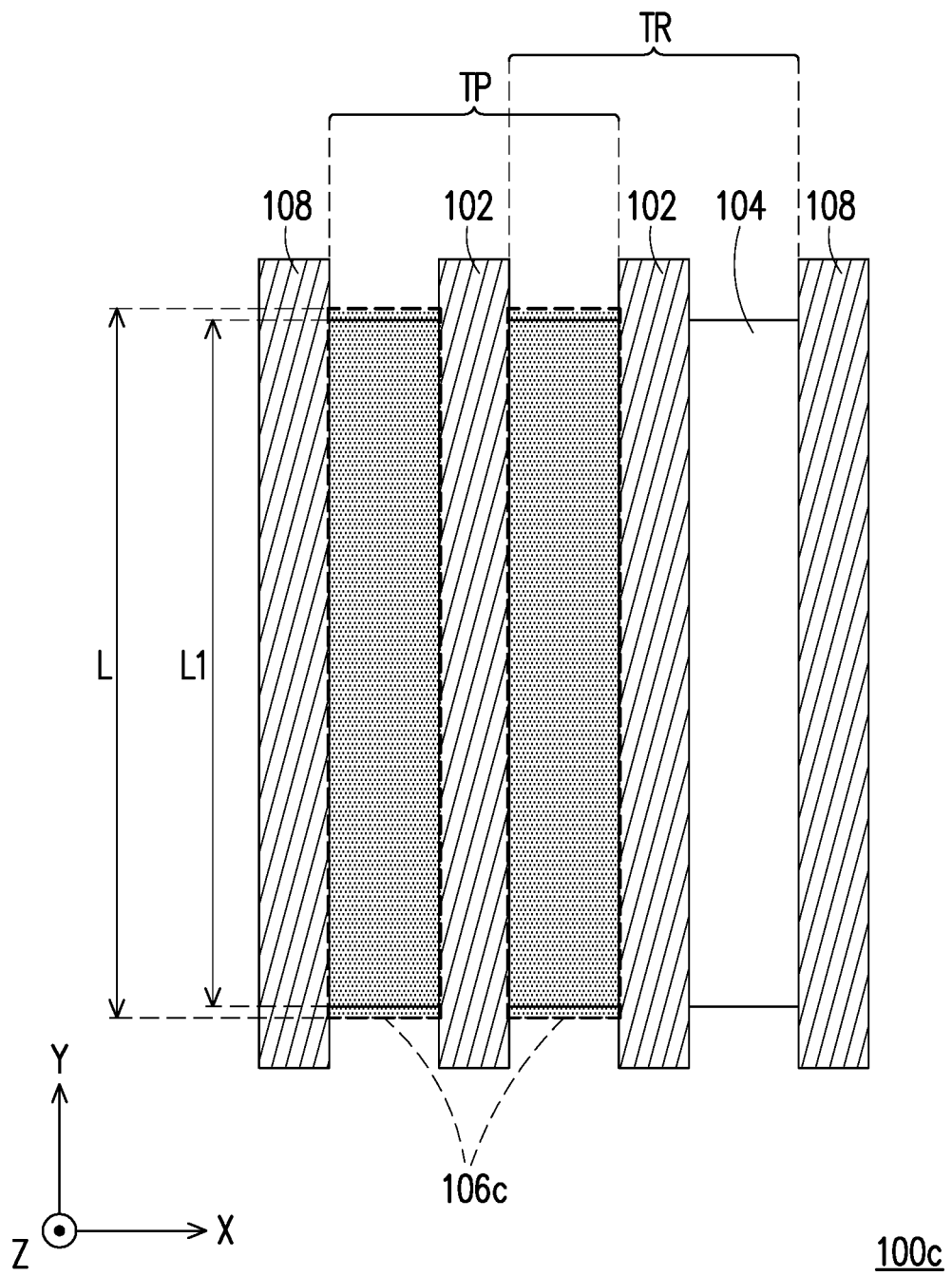

Referring to FIG. 3C, a single embedded insulating structure 106c is overlapped with the source/drain electrode 104 located between the gate structure 102 of the program transistor TP and the closest dummy gate structure 108, and another single embedded insulating structure 106c is lying under the source/drain electrode 104 shared by the read transistor TR and the program transistor TP. Each embedded insulating structure 106c may be regarded as a structure merged by a column of the embedded insulating structures 106 as shown in FIG. 2B. In some embodiments, a length L of the embedded insulating structures 106c along the second direction Y may be substantially equal to or greater than a length L1 of the source/drain electrodes 104 along the second direction Y.

Figure 3D:
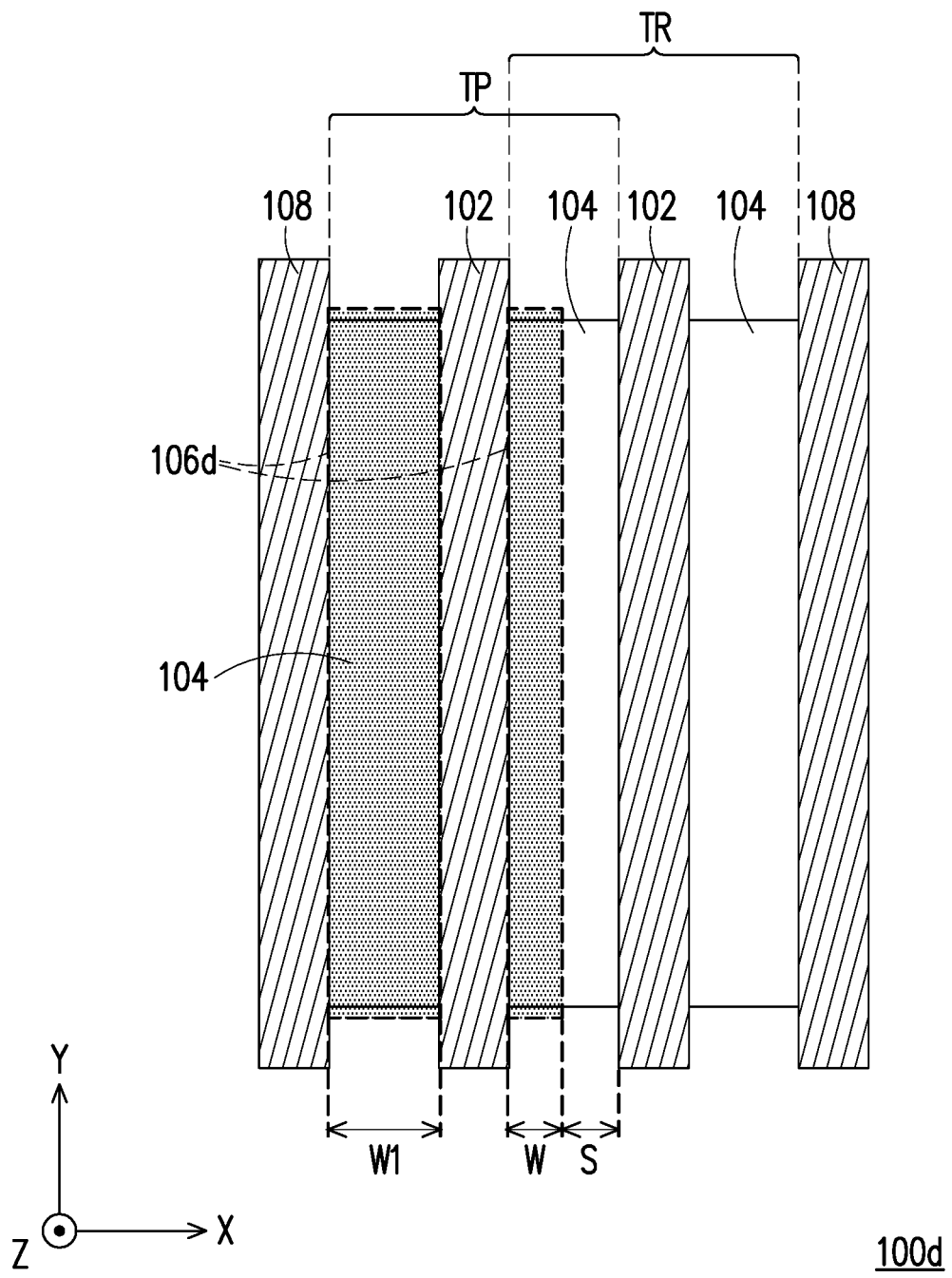

Referring to FIG. 3C and FIG. 3D, embodiments shown in FIG. 3D are similar to the embodiments as described with reference to FIG. 3C, except that a portion of one of the source/drain electrodes 104 of the program transistor TP overlapped with an embedded insulating structure 106d as shown in FIG. 3D is not reaching to the far end of this source/drain electrode 104 (facing away from the gate structure 102 of the program transistor TP). That is, a portion of this source/drain electrode 104 away from the gate structure 102 of the program transistor TP is not overlapped with any of the embedded insulating structures 106d. For instance, a portion of the shared source/drain electrode 104 overlapped with one of the embedded insulating structures 106d is not reaching to the far end of this shared source/drain electrode 104, and a portion of the shared source/drain electrode 104 away from the gate structure 102 of the program transistor TP is not overlapped with the embedded insulating structures 106d. Thus, the embedded insulating structure 106d overlapped with the shared source/drain electrode 104 is laterally spaced apart from the gate structure 102 of the read transistor TR. As similar to the embodiments described with reference to FIG. 3A, this embedded insulating structure 106d may have the width W smaller than the width W1 of the other embedded insulating structure 106d. In addition, a non-zero lateral spacing S is in between the gate structure 102 of the read transistor TR and this embedded insulating structure 106d.

Figure 3E:
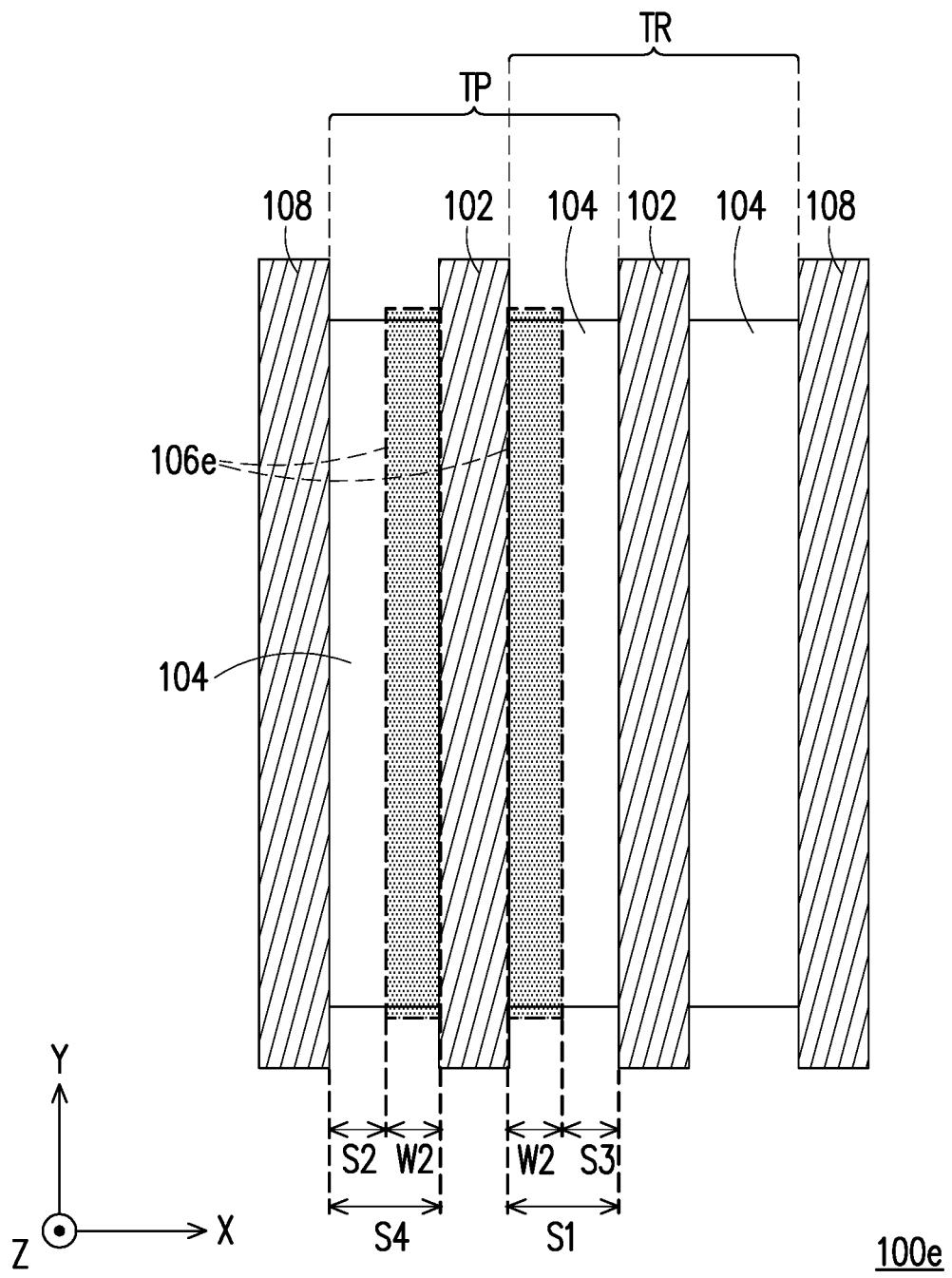

Referring to FIG. 3D and FIG. 3E, embodiments shown in FIG. 3E are similar to the embodiments as described with reference to FIG. 3D, except that portions of both source/drain electrodes 104 of the program transistor TP overlapped with embedded insulating structures 106e as shown in FIG. 3E are not reaching to the far ends of these source/drain electrodes 104 (facing away from the gate structure 102 of the program transistor TP). That is, portions of these source/drain electrodes 104 away from the gate structure 102 of the program transistor TP are not overlapped with any of the embedded insulating structures 106e. As similar to the embodiments described with reference to FIG. 3B, the embedded insulating structures 106e shown in FIG. 3E may have the width W2 smaller than the spacing S1 between the adjacent gate structures 102 and the spacing S4 between the gate structure 102 of the program transistor TP and the closest dummy gate structure 108. In addition, the embedded insulating structure 106e lying under the source/drain electrode 104 between the gate structure 102 of the program transistor TP and the closest dummy gate structure 108 is laterally spaced apart from this dummy gate structure 108 by the spacing S2, and the embedded insulating structure 106e lying under the shared source/drain electrode 104 is laterally spaced apart from the gate structure 102 of the read transistor TR by the spacing S3.

Figure 4:
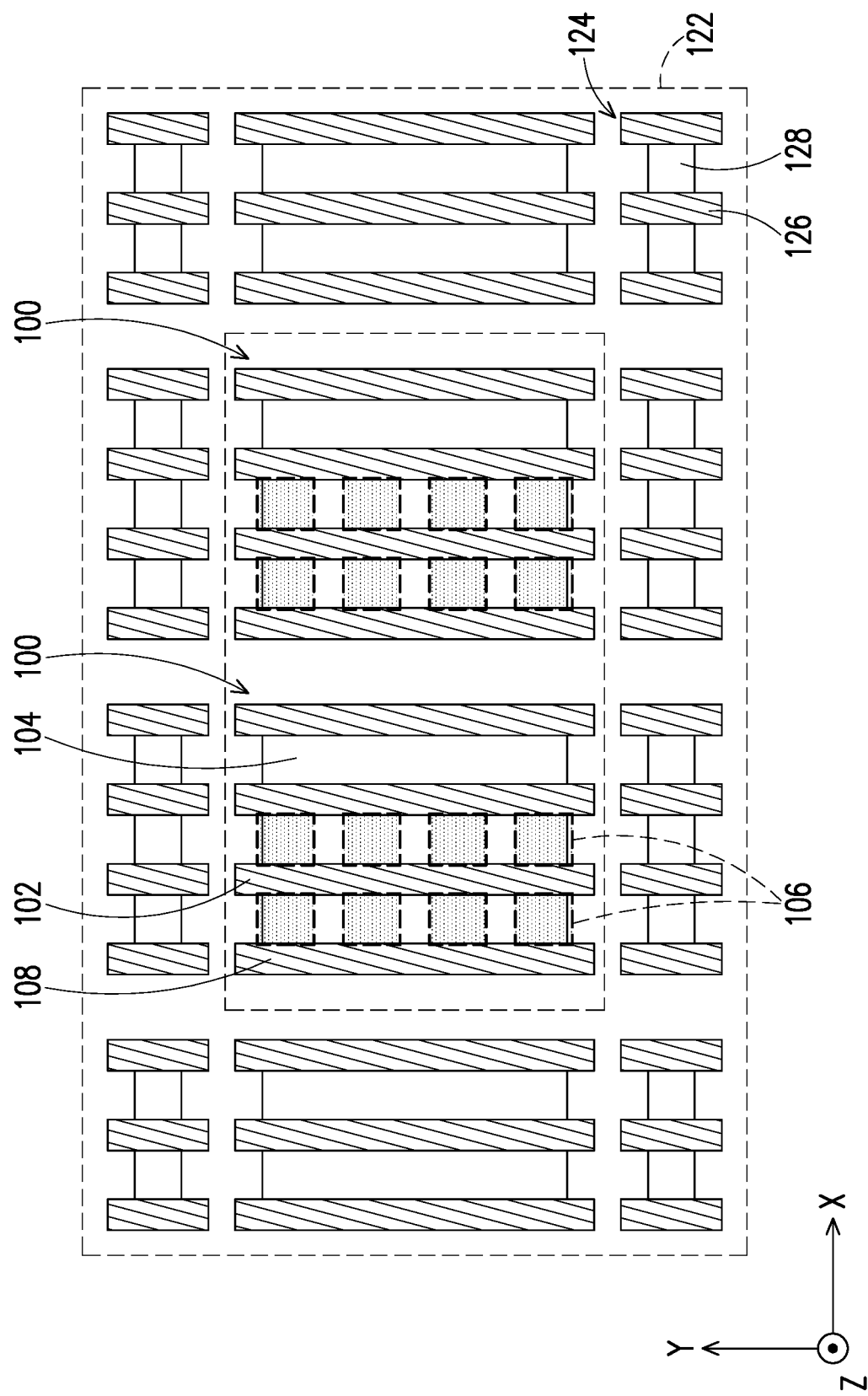
FIG. 4 is a schematic top view illustrating some antifuse cells enclosed by a guard ring according to some embodiments of the present disclosure.

FIG. 4 is a schematic top view illustrating some of the antifuse cells (e.g., the antifuse cells 100 as shown in FIG. 2B) enclosed by a guard ring 122 according to some embodiments of the present disclosure.

Referring to FIG. 4, some of the antifuse cells 100 are laterally surrounded by the guard ring 122. Even though the guard ring 122 is depicted as laterally surrounding two of the antifuse cells 100, the guard ring 122 may laterally surround a single antifuse cell 100 or more than two of the antifuse cells 100. In some embodiments, the guard ring 122 includes a plurality of dummy cells 124. The dummy cells 124 may be laterally separated from one another. The dummy cells 124 and the antifuse cells 100 may be arranged in an array, in which the antifuse cells 100 are surrounded by the dummy cells 124. Some of the dummy cells 124 (or some of the dummy cells 124 and some of the antifuse cells 100) arranged in the same row may have the same length along the second direction Y, and some of the dummy cells 124 (or some of the dummy cells 124 and some of the antifuse cells 100) arranged in the same column may have the same width along the first direction X. The dummy cell 124 is similar to the antifuse cell 100, except that the dummy cell 124 may not include the embedded insulating structures 106. In some embodiments, the dummy cell 124 includes gate structures 126 and source/drain electrodes 128. As similar to the gate structure 102 and the dummy gate structures 108 of the antifuse cell 100 shown in FIG. 2B, the gate structures 126 of the dummy cell 124 are arranged along the first direction X, and extending along the second direction Y. In addition, as similar to the source/drain electrodes 104 of the antifuse cell 100 shown in FIG. 2B, the source/drain electrodes 128 of the dummy cell 124 are located between adjacent gate structures 126. In some embodiments, the dummy cell 124 may further include channel structures (not shown) as similar to the channel structures 110 shown in FIG. 2C, and the gate structures 126 may respectively contain the components as shown in FIG. 2C (e.g., the gate dielectric layer 112, the work function layer 114, the conductive material 116, the gate spacer 118 and the inner spacers 120 as shown in FIG. 2C). Moreover, the dummy cells 124 may be electrically floated, or the transistors in the dummy cells may be maintained in an off state.

Figure 5A:
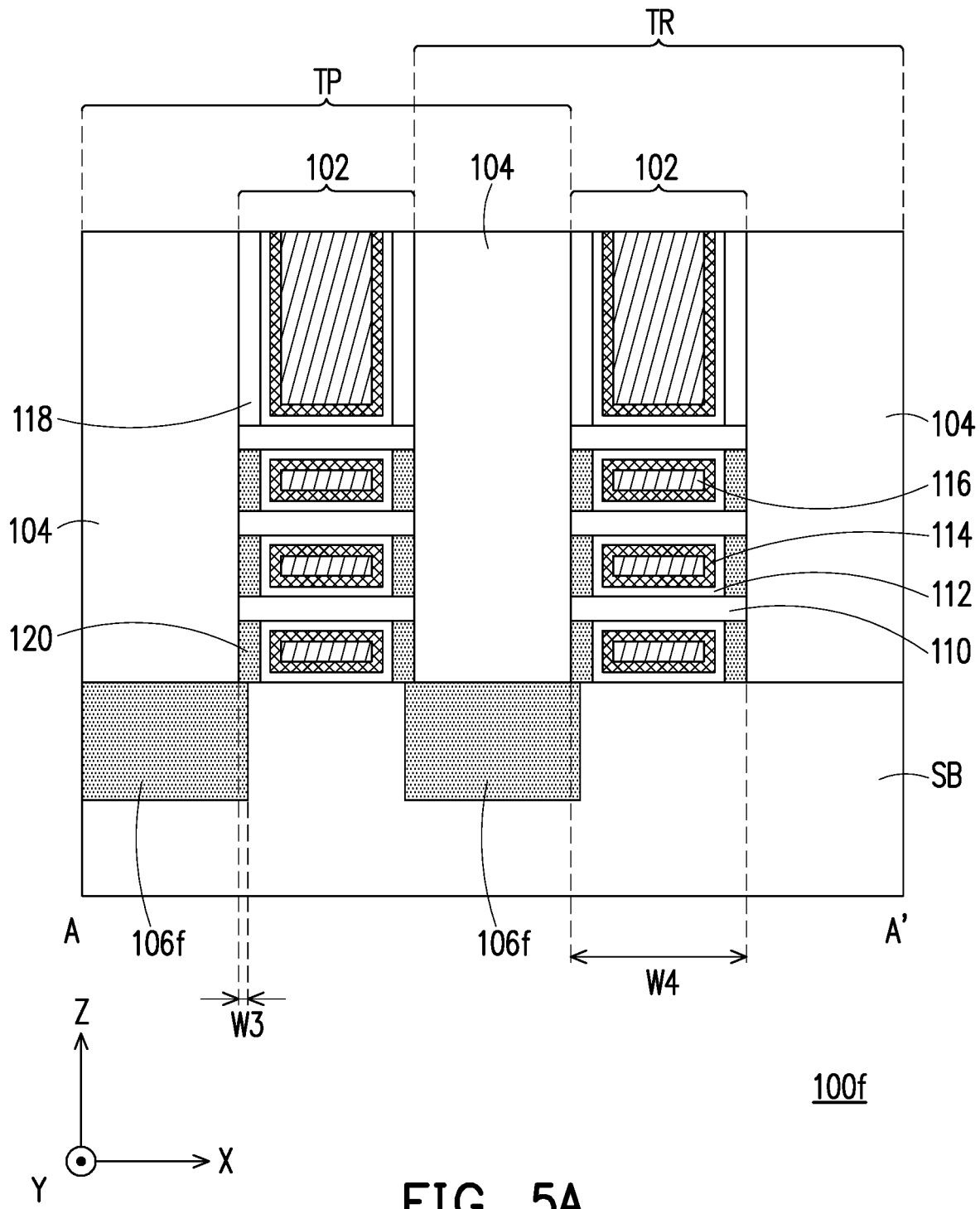
FIG. 5A and FIG. 5B are schematic cross-sectional views illustrating antifuse cells according to some embodiments of the present disclosure.
Figure 5B:
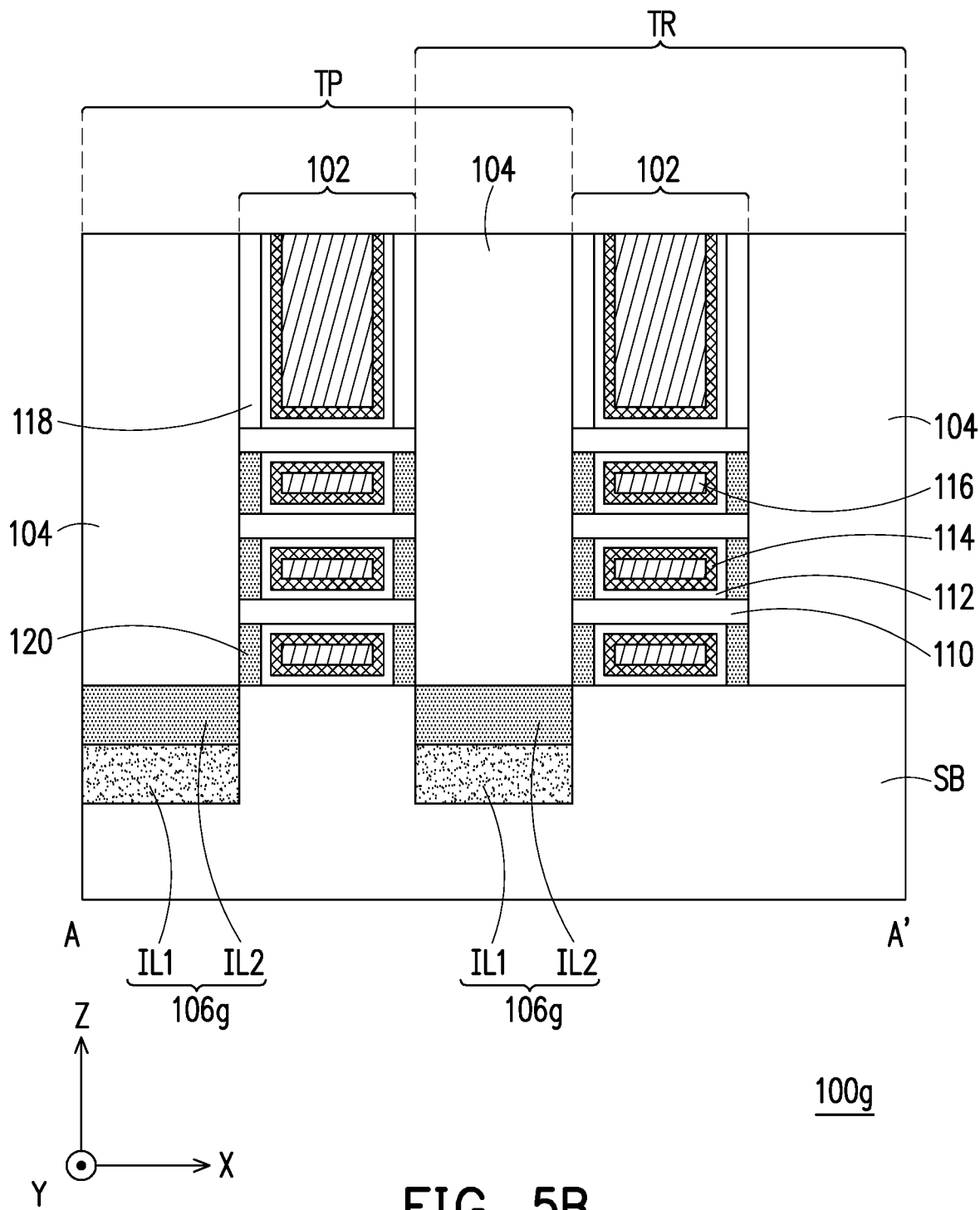

FIG. 5A and FIG. 5B are schematic cross-sectional views illustrating antifuse cells 100f and 100g according to some embodiments of the present disclosure. The antifuse cells 100f and 100g shown in FIG. 5A and FIG. 5B are similar to the antifuse cell 100 as shown in FIG. 2C. Only difference therebetween will be described, the same or the like parts would not be repeated again.

Referring to FIG. 5A, embedded insulating structures 106f of the antifuse cell 100f are partially overlapped with the gate structures 102 of the program transistor TP and the read transistors TR. In some embodiments, the embedded insulating structures 106f extend to regions lying under the inner spacers 120 of the gate structures 102. For instance, a ratio of an overlap width W3 of each gate structure 102 and the underlying embedded insulating structures 106f with respect to a width W4 of each gate structure 102 may be greater than 0, and less than or equal to 0.5.

Referring to FIG. 5B, in some embodiments, embedded insulating structures 106g may be multilayer structures. For instance, the embedded insulating structure 106g may include a first insulating layer IL1 and a second insulating layer IL2 formed over the first insulating layer IL1. The second insulating layer IL2 may be in contact with the overlying source/drain electrodes 104. In addition, the first and second insulating layers IL1 and IL2 may be made of different insulating materials selected from a group consisting of, for example, silicon oxide, silicon nitride, silicon oxynitride, zirconia or the like.

Figure 6:
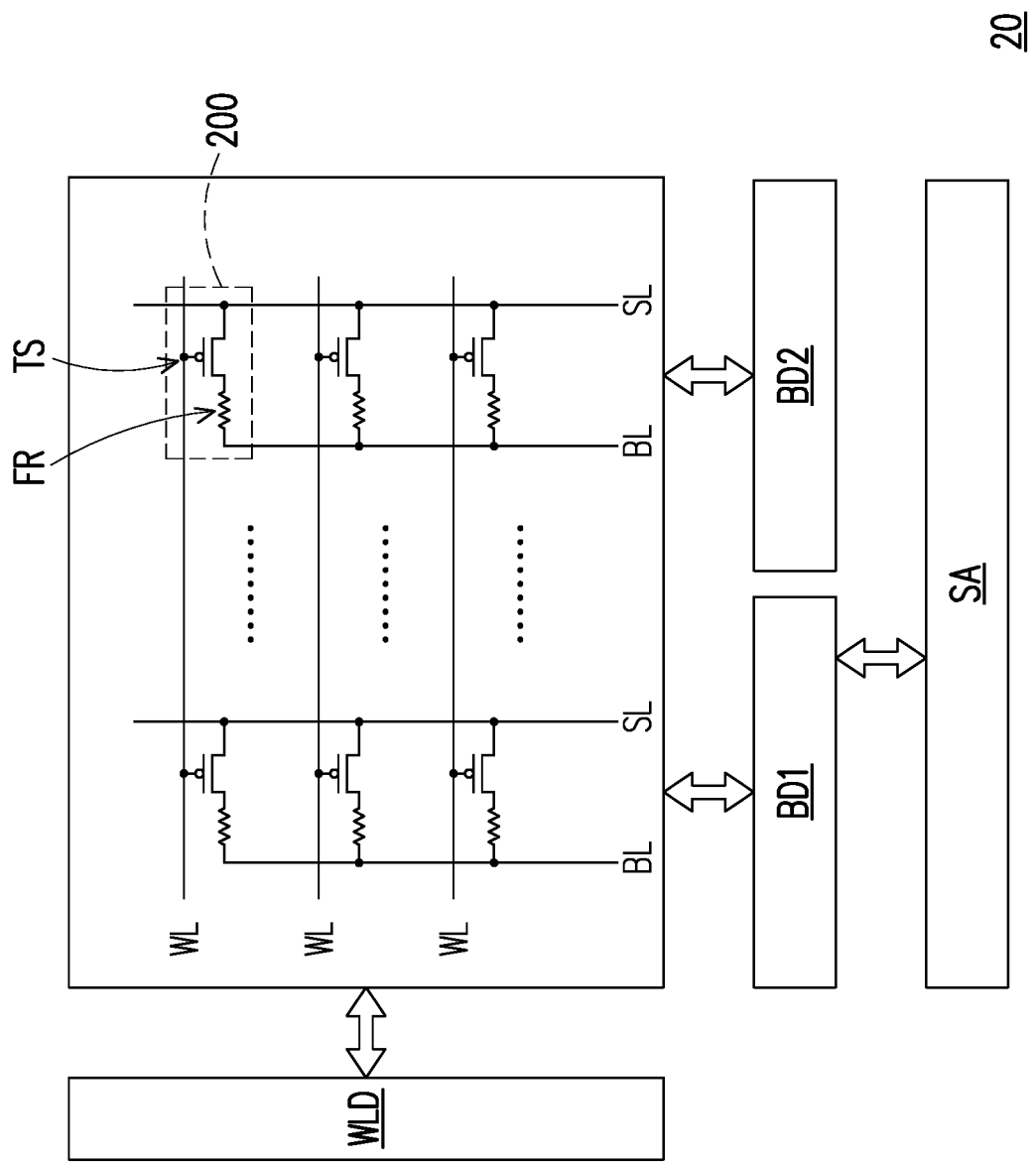
FIG. 6 is a block diagram illustrating a memory device having electrical fuse (efuse) cells according to some embodiments of the present disclosure.
Figure 7A:
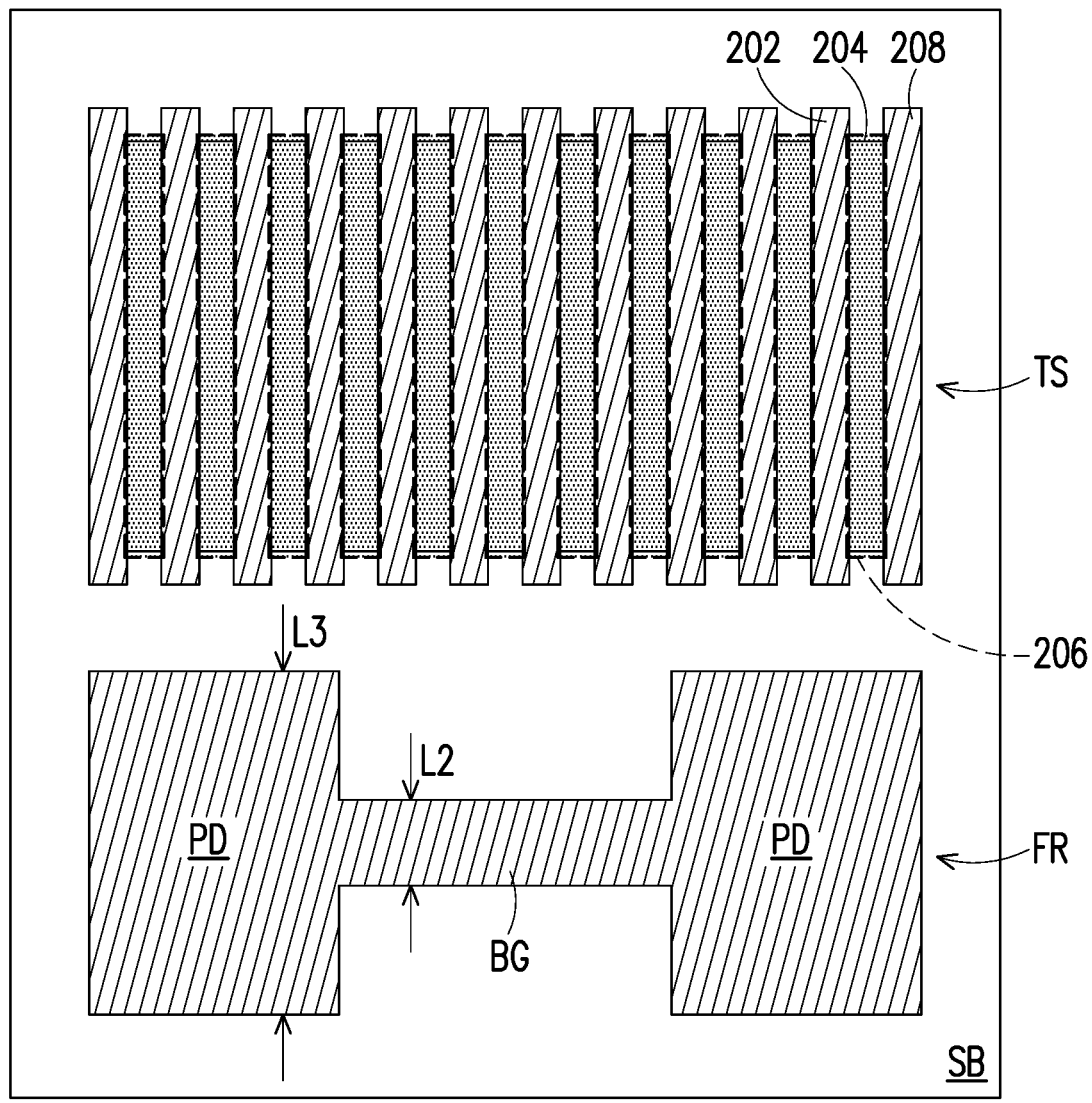
FIG. 7A is a schematic top view illustrating one of the efuse cells shown in FIG. 6.

FIG. 6 is a block diagram illustrating a memory device 20 having electrical fuse (efuse) cells 200 according to some embodiments of the present disclosure. FIG. 7A is a schematic top view illustrating one of the efuse cells 200 shown in FIG. 6.

Referring to FIG. 6, the memory device 20 includes a plurality of efuse cells 200. In some embodiments, each of the efuse cells 200 includes a selection transistor TS and a fuse resistor FR. The fuse resistor FR is electrically coupled to a source/drain electrode of the selection transistor TS and a bit line BL, and the other source/drain electrode of the selection transistor TS is electrically coupled to a source line SL. In addition, a gate electrode of the selection transistor TS is electrically coupled to a word line WL. During a programming operation, the selection transistor TS is turned on by a voltage provided through the word line WL, and a large current is provided to the fuse resistor FR through the bit line BL. As a result of the large input current, the fuse resistor FR may be ruptured due to thermal effect and electromigration effect, and a resistance of the fuse resistor FR is significantly increased. That is, the fuse resistor FR is in a low resistance state (i.e., having a logic data "0") before being ruptured, and turns into a high resistance state (i.e., having a logic data "1") after being ruptured. Since the rupture of the fuse resistor FR is irrecoverable, the fuse resistor FR is functioned as an OTP device. On the other hand, during a reading operation, the selection transistor TS is turned on by a voltage provided through the word line WL, and the bit line BL is configured to receive a read voltage. In this way, by detecting the feedback current in correspondence to the read voltage, a resistance state of the fuse resistor FR can be detected. In some embodiments, the efuse cells 200 are arranged in an array, which has multiple rows and multiple columns. A column of the efuse cells 200 may share one of the bit lines BL and one of the source lines SL, and a row of the efuse cells 200 may share one of the word lines WL. In some embodiments, the word lines WL are controlled by a word line driver WLD. The bit lines BL are controlled by a first bit line driver BD1 during a programming operation, and are controlled by a second bit line driver BD2 during a reading operation. In addition, the read out of the resistance state of the efuse cells 200 can be facilitated by a sense amplifier SA electrically coupled to the second bit line driver BD2.

Referring to FIG. 7A, one of the efuse cells 200 shown in FIG. 6 is depicted in FIG. 7A. In some embodiments, the selection transistor TS of the efuse cells 200 may include a plurality of sub-transistors connected with one another, thus an on-resistance ($R_{on}$) of the selection transistor TS can be reduced, so as to ensure the rupture of the fuse resistor FR during a programming operation. In these embodiments, the selection transistor TS may include a plurality of gate structures 202 and a plurality of source/drain electrodes 204. The gate structures 202 and the source/drain electrodes 204 are alternately arranged along the first direction X, and are extending along the second direction Y. Each of the gate structures 202 is disposed between a pair of the source/drain electrodes 204, and the gate structures 202 of the efuse cell 200 may be electrically coupled to one of the word lines WL as shown in FIG. 6. In addition, one of the outermost source/drain electrodes 204 may be electrically coupled to one of the bit lines BL (as shown in FIG. 6) through the fuse resistor FR, and another outermost source/drain electrodes 204 may be electrically coupled to one of the source lines SL (as shown in FIG. 6). As similar to the program transistor TP and the read transistor TR as shown in FIG. 2A, the gate structures 202 and the source/drain electrodes 204 of the selection transistor TS shown in FIG. 7A are disposed over the substrate SB, and the selection transistor TS further includes embedded insulating structures 206 extending into the substrate SB from a top surface of the substrate SB. In some embodiments, the embedded insulating structures 206 are respectively lying under one of the source/drain electrodes 204. In these embodiments, as similar to the embodiments described with reference to FIG. 3C, each embedded insulating structure 206 shown in FIG. 7A may extend along the second direction Y, and may be overlapped with substantially the entire overlying source/drain electrode 204. In this way, a length (along the second direction Y) of the embedded insulating structures 206 may be substantially equal to or greater than a length (along the second direction Y) of the source/drain electrodes 204. In addition, about 30% to 80% of a total area of the selection transistor TS may be overlapped with the embedded insulating structure 206. Furthermore, in some embodiments, these sub-transistors are GAA FETs. In these embodiments, as similar to the embodiments described with reference to FIG. 2C, a plurality of channel structures (not shown) may penetrate through each gate structure 202 and connect a pair of the source/drain electrodes 204. In addition, the gate structures 202 may respectively contain the components as shown in FIG. 2C (e.g., the gate dielectric layer 112, the work function layer 114, the conductive material 116, the gate spacer 118 and the inner spacers 120 as shown in FIG. 2C). Moreover, as similar to the embodiments as described with reference to FIG. 2A, the efuse cell 200 may include dummy gate structures 208. The dummy gate structures 208 are structurally similar to the gate structures 202, and the gate structures 202 and the source/drain electrodes 204 may be arranged between the dummy gate structures 208.

On the other hand, the fuse resistor FR may be formed in an interconnection structure (not shown) over the selection transistor TS, and may be electrically coupled to the selection transistor TS by some interconnections in the interconnection structure (not shown). This electrical coupling between the fuse resistor FR and the selection transistor TS can be seen in FIG. 6. In some embodiments, the fuse resistor FR is laterally spaced apart from the selection transistor TS. In addition, in some embodiments, the fuse resistor FR has two pad portions PD and a bridge portion BG connecting between the pad portions PD. For instance, the pad portions PD may be arranged along the first direction X at the same height, and the bridge portion BG may extend along the same direction (i.e., the first direction X) between the pad portions PD. During a programming operation of the efuse cell 200, the bridge portion BG may be ruptured due to thermal effect and electromigration effect, thus a resistance of the fuse resistor FR is significantly increased, and logic data "1" can be written into the efuse cell 200. In some embodiments, the bridge portion BG may be a necking portion of the fuse resistor FR, such that rupture of the bridge portion BG during a programming operation can be facilitated. As shown in FIG. 7A, a length L2 of the bridge portion BG along the second direction Y may be much smaller than a length L3 of the pad portions PD along the second direction Y. Alternatively, the length L2 may be substantially equal to the length L3. For instance, a ratio of the length L2 with respect to the length L3 may range from 0.1 to 1.

The embedded insulating structures 206, which are made of an insulating material, have a heat dissipation ability much lower than a heat dissipation ability of the substrate SB that includes a semiconductor material. Consequently, by replacing portions of the substrate SB with the embedded insulating structures 206, a total volume of the substrate SB may be reduced, and a structure including the substrate SB and the embedded insulating structures 206 may have a relatively low heat dissipation ability (as compared to a heat dissipation ability of a semiconductor substrate without partially replaced by an insulating material). In this way, during a programming operation of the efuse cell 200, heat can be more centralized at the fuse resistor FR, and rupture of the fuse resistor FR can be facilitated. Therefore, a program voltage of the efuse cell 200 can be lowered, and the memory device 20 with the embedded insulating structures 206 can be more compatible with other integrated circuits.

In alternative embodiments, as similar to the embodiments described with reference to FIG. 2B, FIG. 3A, FIG. 3B, FIG. 3D and FIG. 3E, the embedded insulating structures 206 may respectively be replaced by separated embedded insulating structures, and/or a width (along the first direction X) of at least some of the embedded structures 206 may be adjusted to be less than a spacing between adjacent gate structures 202.

Figure 7B:
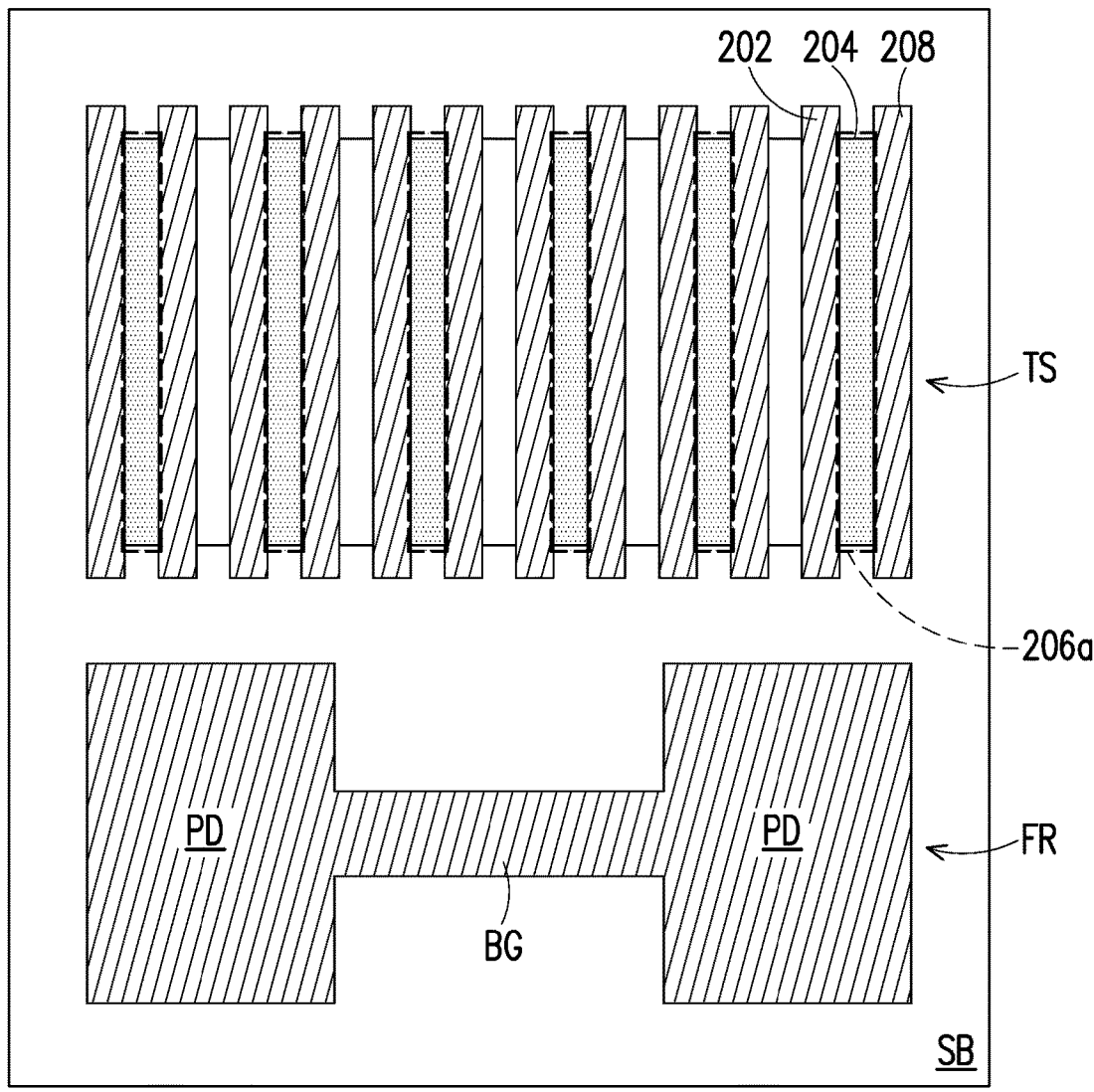
FIG. 7B is a schematic top view illustrating an efuse cell according to some embodiments of the present disclosure.
Figure 7B:
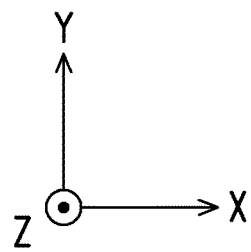

FIG. 7B is a schematic top view illustrating an efuse cell 200a according to some embodiments of the present disclosure. The efuse cell 200a shown in FIG. 7B is similar to the efuse cell 200 as shown in FIG. 7A. Only difference therebetween will be described, the same or the like parts would not be repeated again.

Referring to FIG. 7B, in some embodiments, one of the source/drain electrodes 204 of each sub-transistor is overlapped with one of the embedded insulating structures 206a, whereas the other one of the source/drain electrodes 204 of each sub-transistor is not overlapped with any of the embedded insulating structures 206a. In this way, the embedded insulating structures 206a may be alternately arranged between adjacent gate structures 202 along the arrangement direction of the gate structures 202 (e.g., the first direction X). Those skilled in the art may adjust sequence of the embedded insulating structures 206a and the gate structures 202 along the arrangement direction of the gate structures 202, the present disclosure is not limited thereto. In addition, as similar to the embodiments described with reference to FIG. 2B, FIG. 3A and FIG. 3B, the embedded insulating structures 206a may respectively be replaced by separated embedded insulating structures, and/or a width (along the first direction X) of at least some of the embedded structures 206a may be adjusted to be less than a spacing between adjacent gate structures 202.

Figure 8:
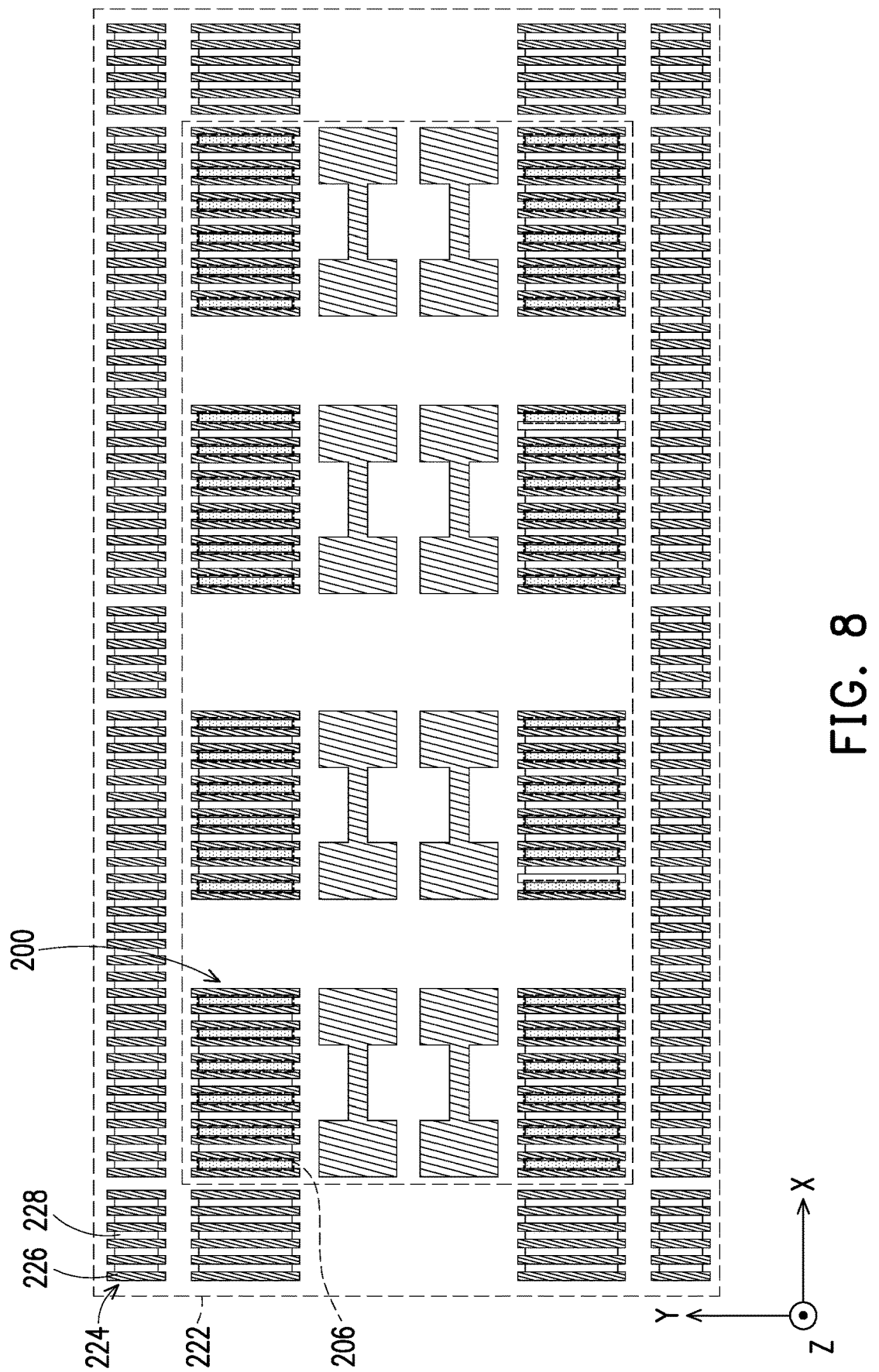
FIG. 8 is a schematic top view illustrating some efuse cells enclosed by a guard ring according to some embodiments of the present disclosure.

FIG. 8 is a schematic top view illustrating some efuse cells 200 (e.g., the efuse cells 200) enclosed by a guard ring 222 according to some embodiments of the present disclosure.

Referring to FIG. 8, as similar to the embodiments described with reference to FIG. 4, some of the efuse cells as shown in FIG. 8 are laterally surrounded by the guard ring 222. Even though the guard ring 222 is depicted as laterally surrounding eight of the efuse cells 200, the guard ring 222 may otherwise laterally surround less than or more than eight of the efuse cells 200. In some embodiments, the guard ring 222 includes a plurality of dummy cells 224 separated from one another. The dummy cells 224 are similar to the selection transistors TS of the efuse cells 200, except that the dummy cells 224 may not include the embedded insulating structures 206. As similar to the dummy cells 124 as described with FIG. 4, the dummy cells 224 as shown in FIG. 8 respectively include gate structures 226 and source/drain electrodes 228, and may include channel structures (not shown) disposed in the gate structures 226. Some of the dummy cells 224 (or some of the dummy cells 224 and the selection transistors TS of some of the efuse cells 200) arranged in the same row may have the same length along the second direction Y, and some of the dummy cells 224 arranged in the same column may have the same width along the first direction X. Moreover, in some embodiments, the fuse resistors FR are arranged as multiple rows (e.g., two rows) between the selection transistors TS, and the guard ring 222 may be discontinuous at opposite sides of the fuse resistors FR not facing toward the selection transistors TS. However, those skilled in the art may modify dimensions and arrangement of the dummy cells 224 as well as the arrangement of the efuse cells 200 and the dummy cells 224 according to design requirements, the present disclosure is not limited thereto.

Figure 9:
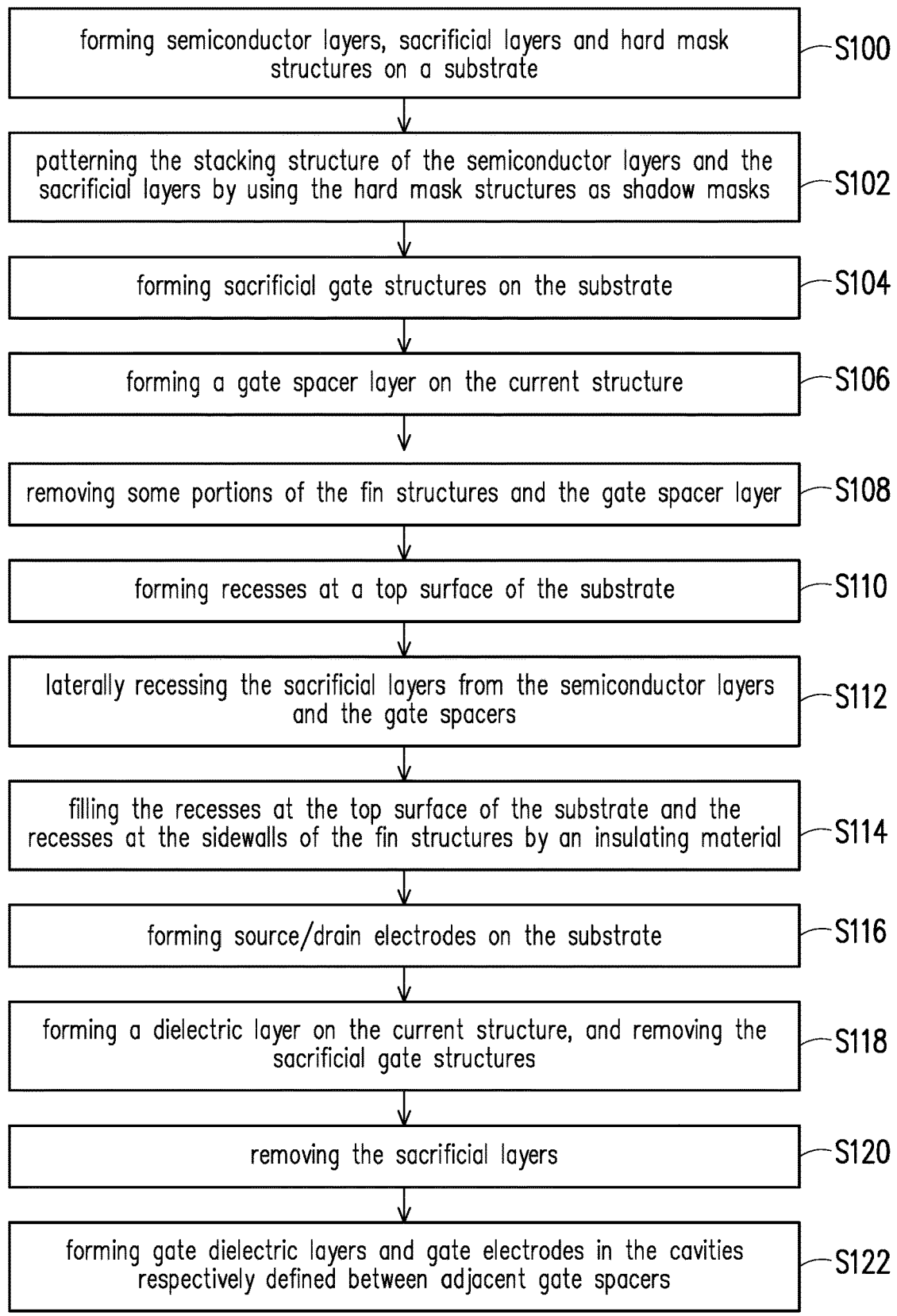
FIG. 9 is a flow diagram illustrating a method for forming transistors and embedded insulating structures according to some embodiments of the present disclosure.
Figure 10A:
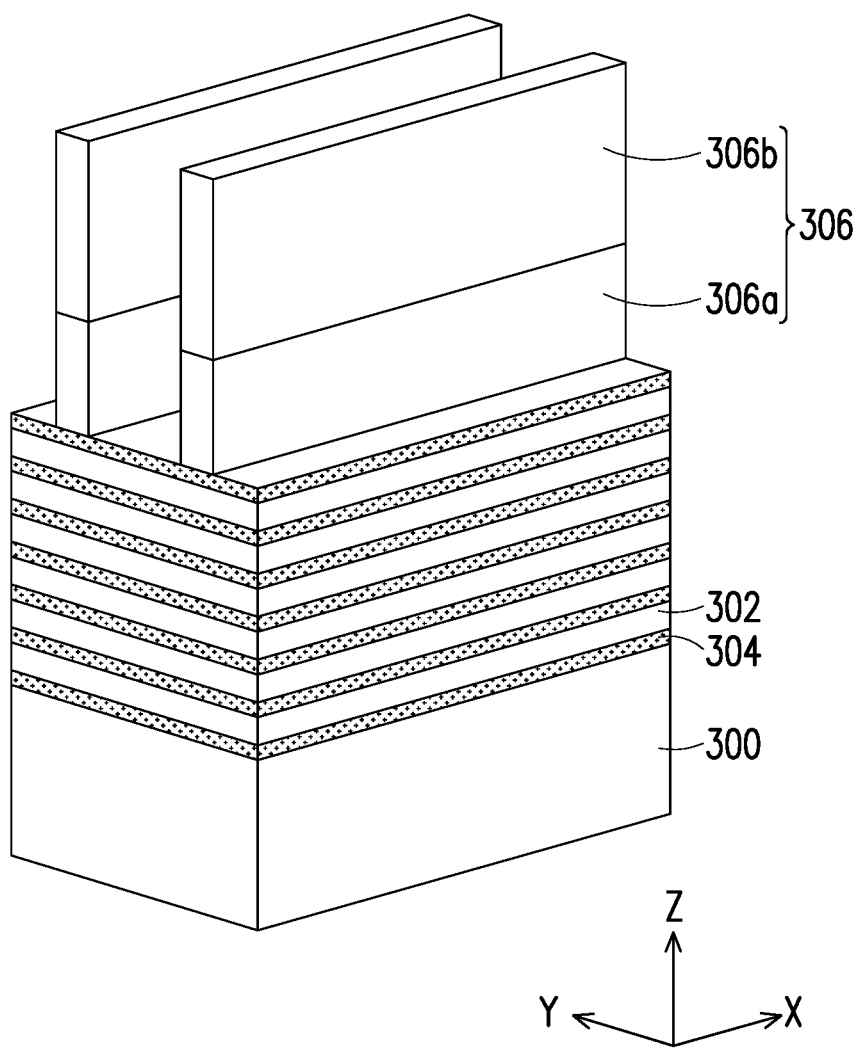
FIG. 10A through FIG. 10L are schematic cross-sectional views illustrating structures at various stages during the process for forming the transistors and the embedded insulating structures as shown in FIG. 9.
Figure 10B:
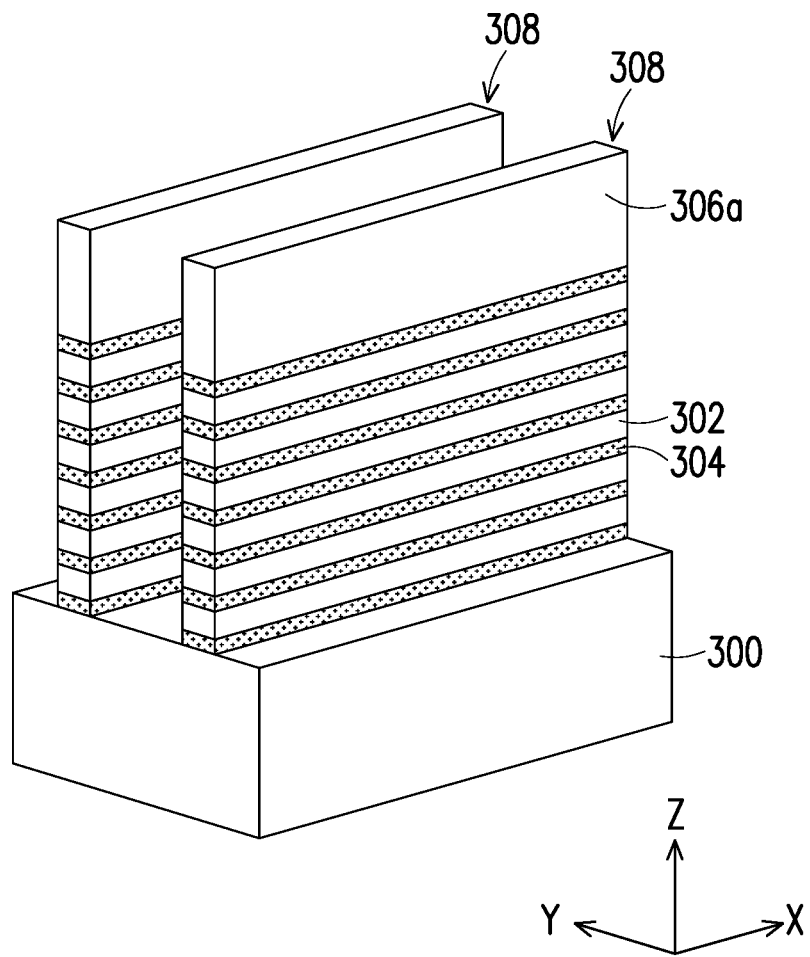
Figure 10C:
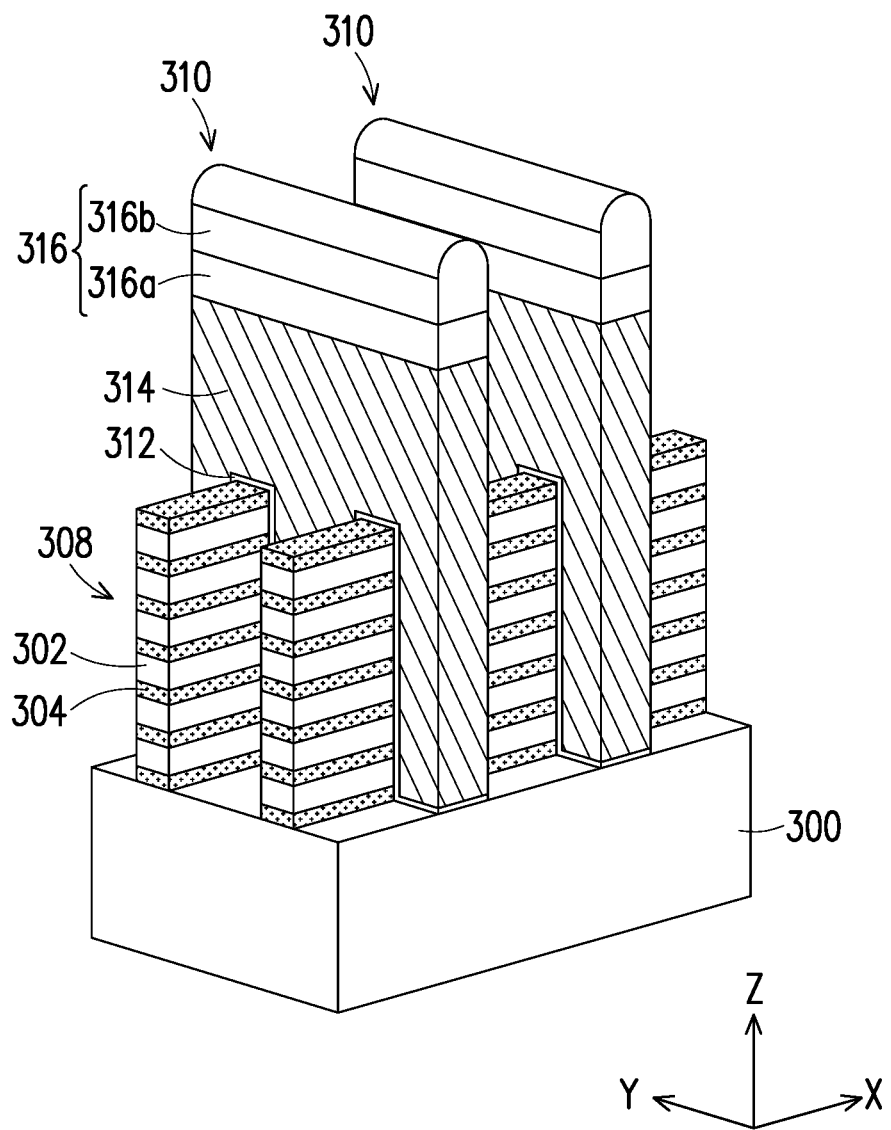
Figure 10D:
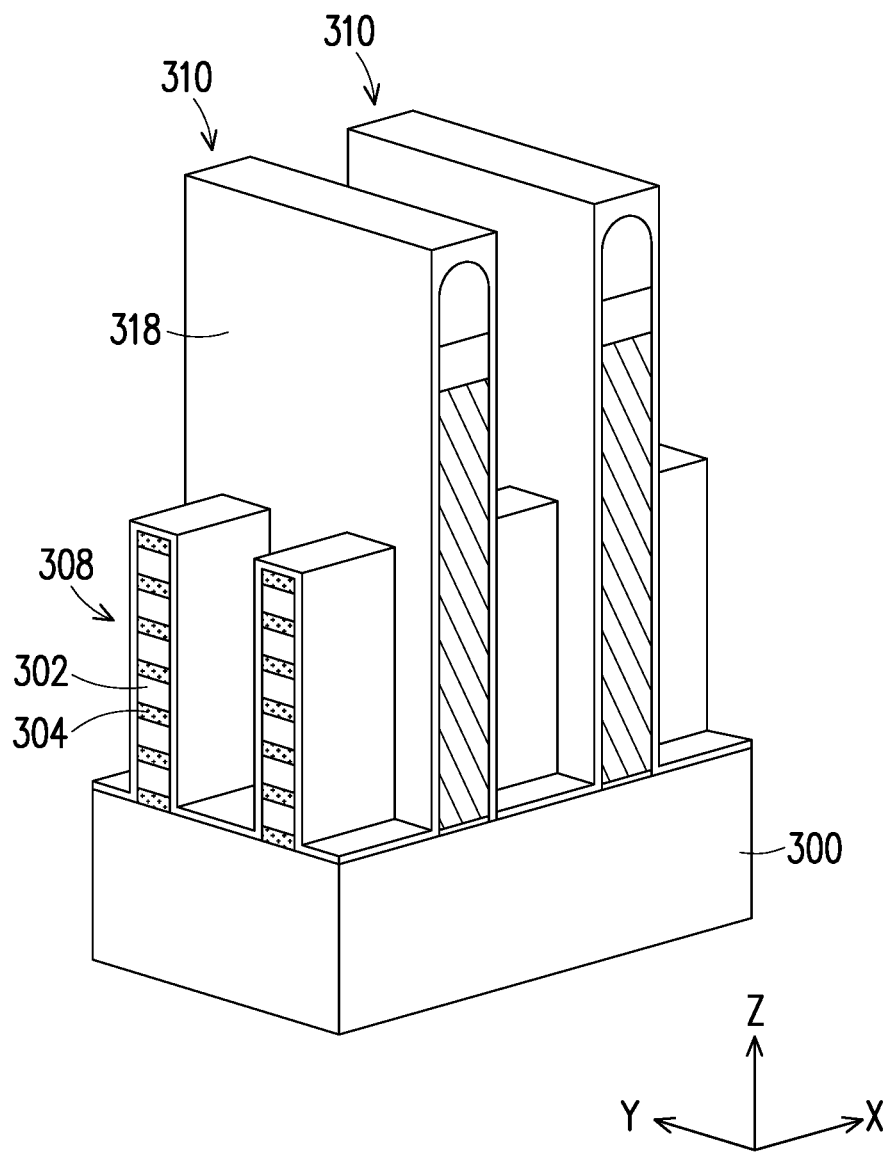
Figure 10E:
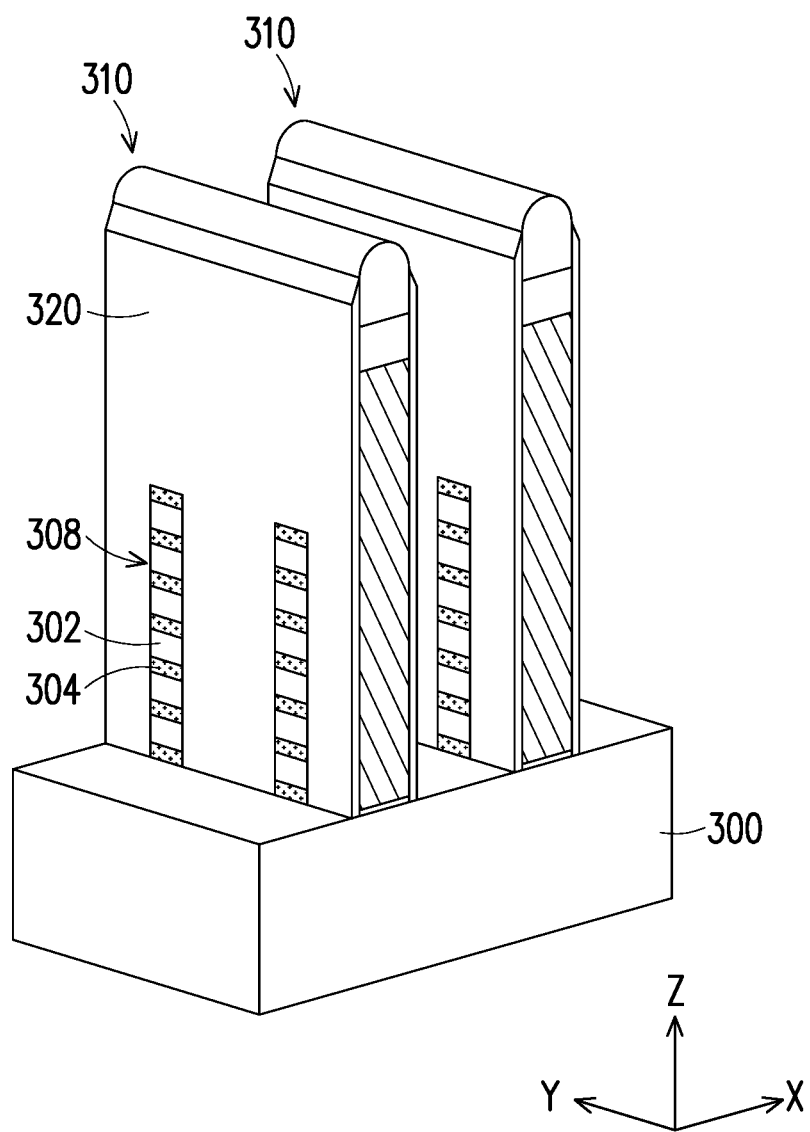
Figure 10F:
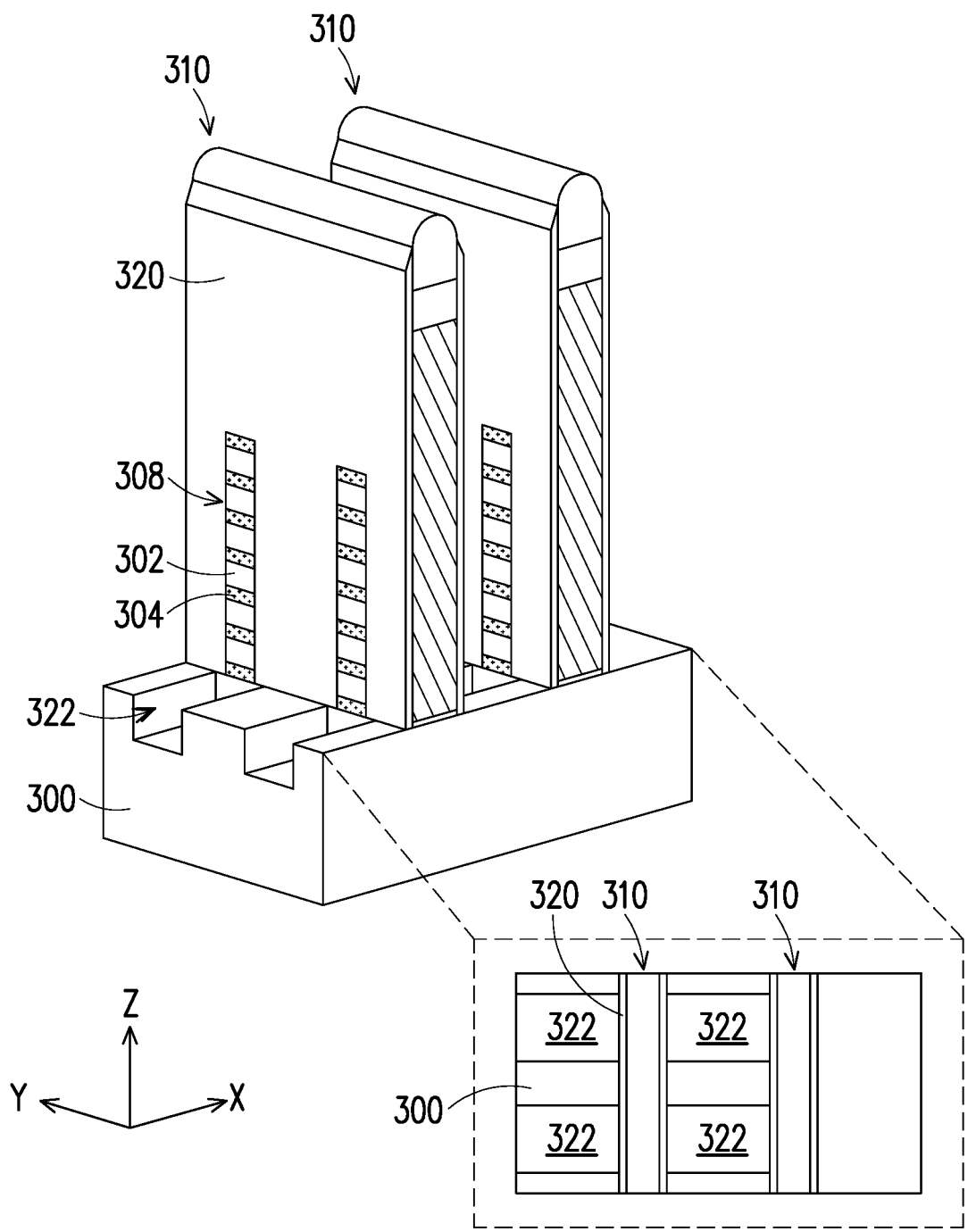
Figure 10G:
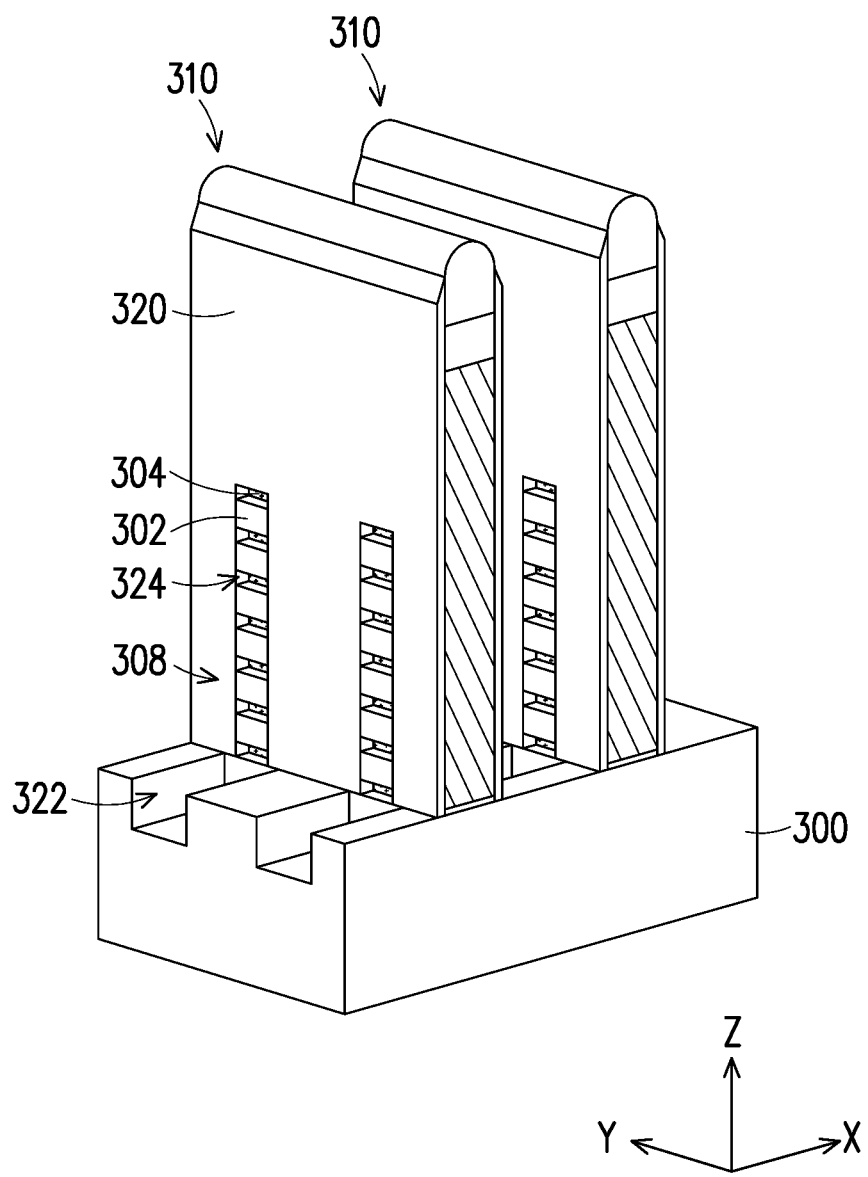
Figure 10H:
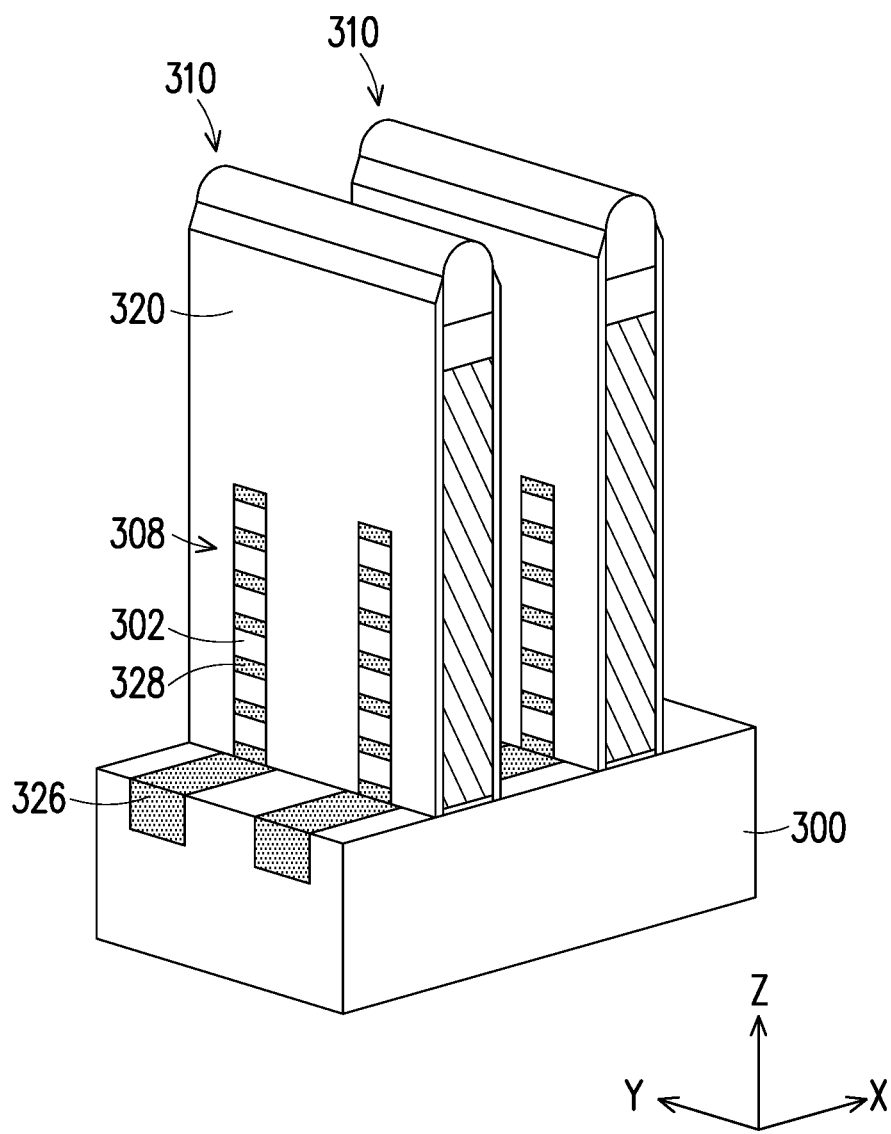
Figure 10I:
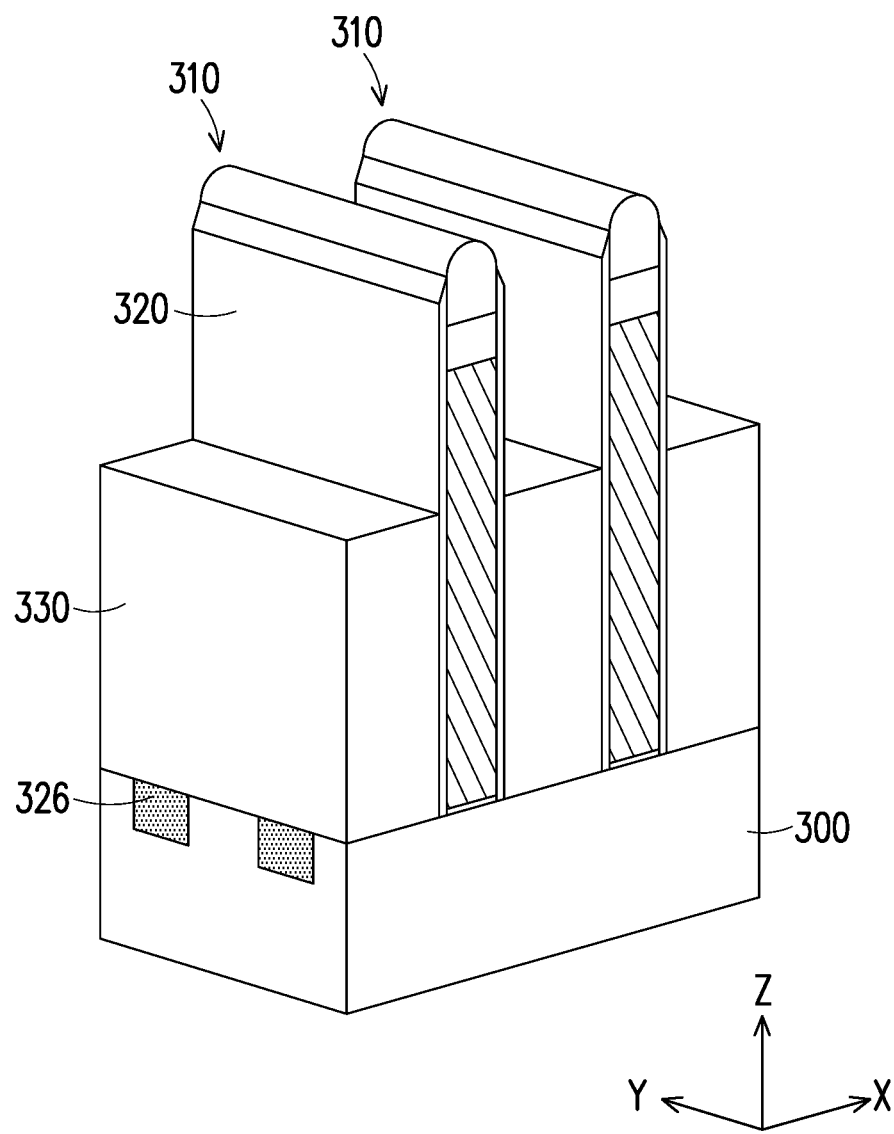
Figure 10J:
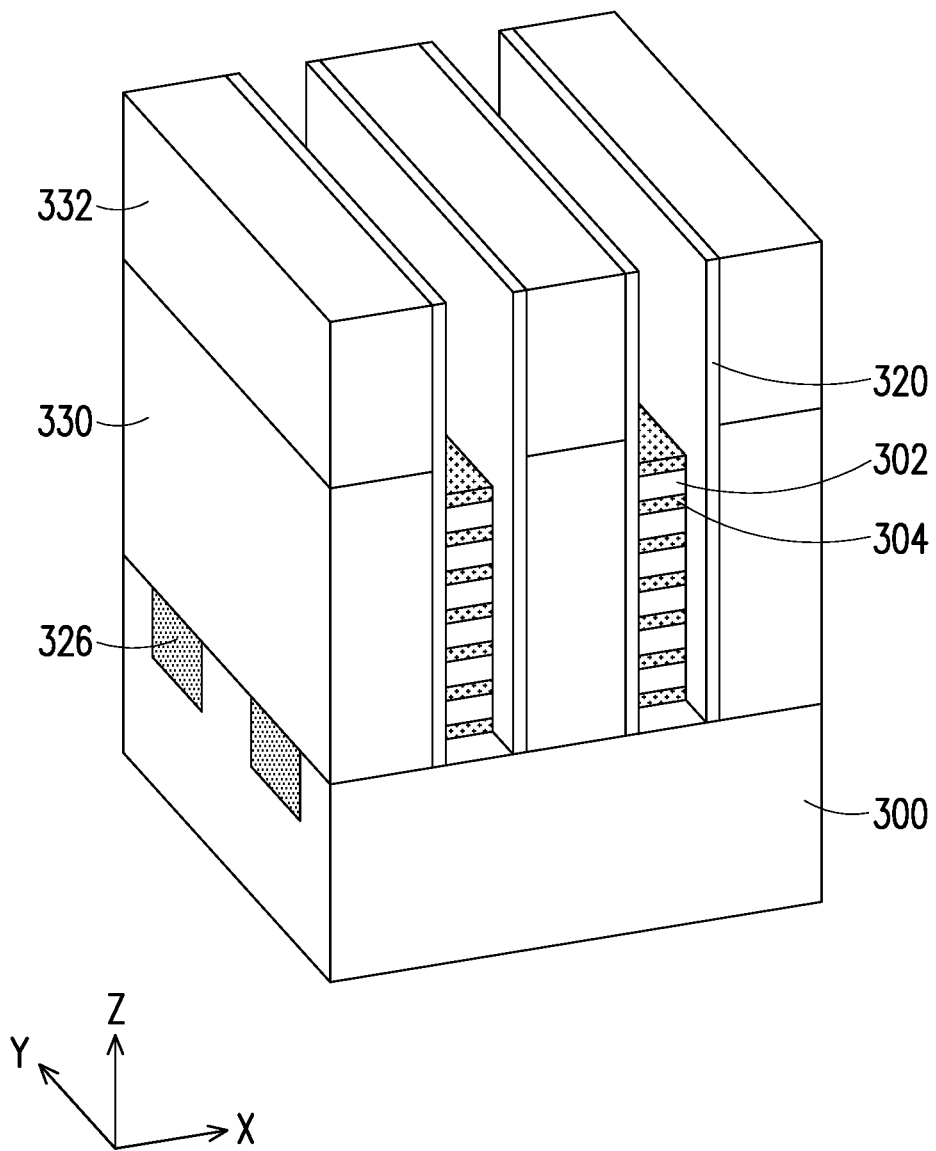
Figure 10K:
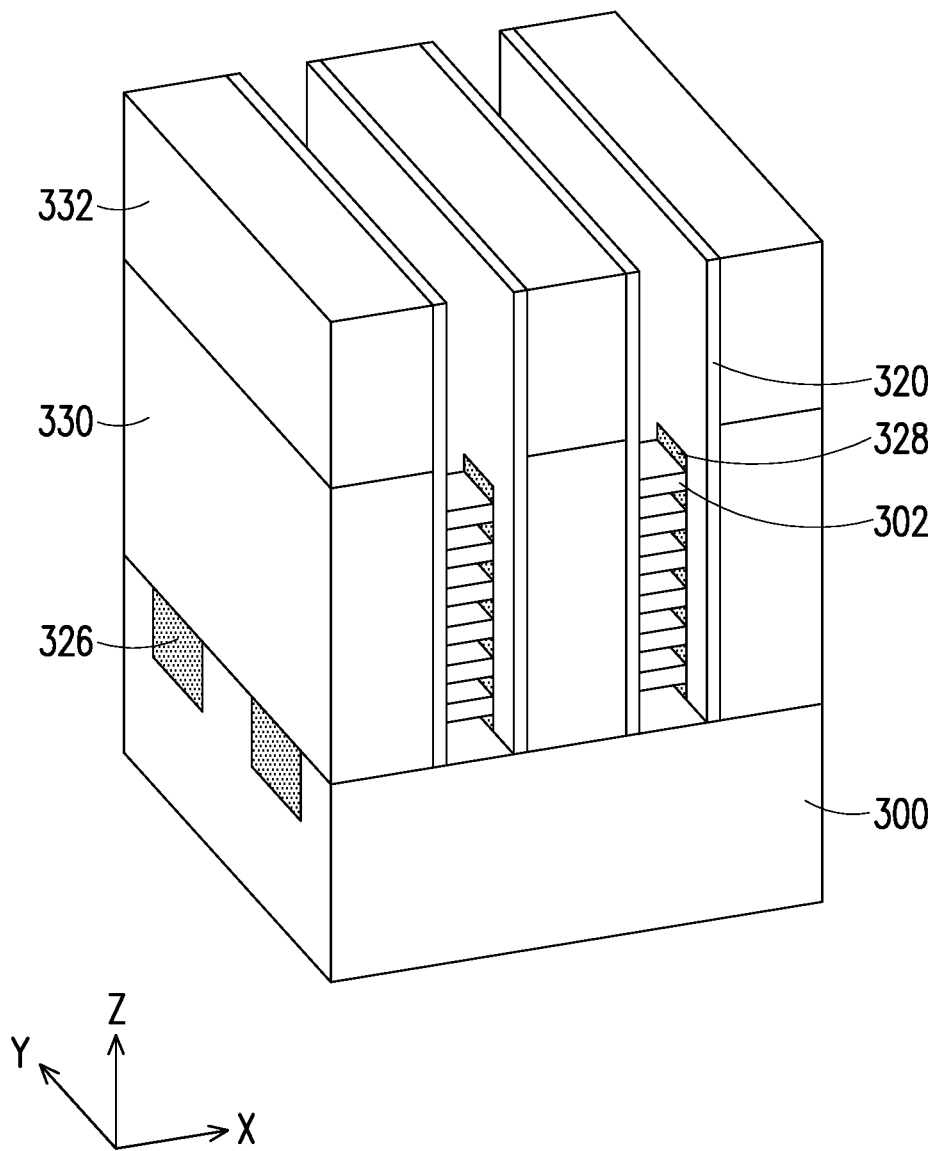

FIG. 9 is a flow diagram illustrating a method for forming transistors and embedded insulating structures according to some embodiments of the present disclosure. FIG. 10A through FIG. 10L are schematic cross-sectional views illustrating structures at various stages during the process for forming the transistors and the embedded insulating structures as shown in FIG. 9. FIG. 10M is a cross-sectional view along a line C-C' shown in FIG. 10L.

Figure 10L:
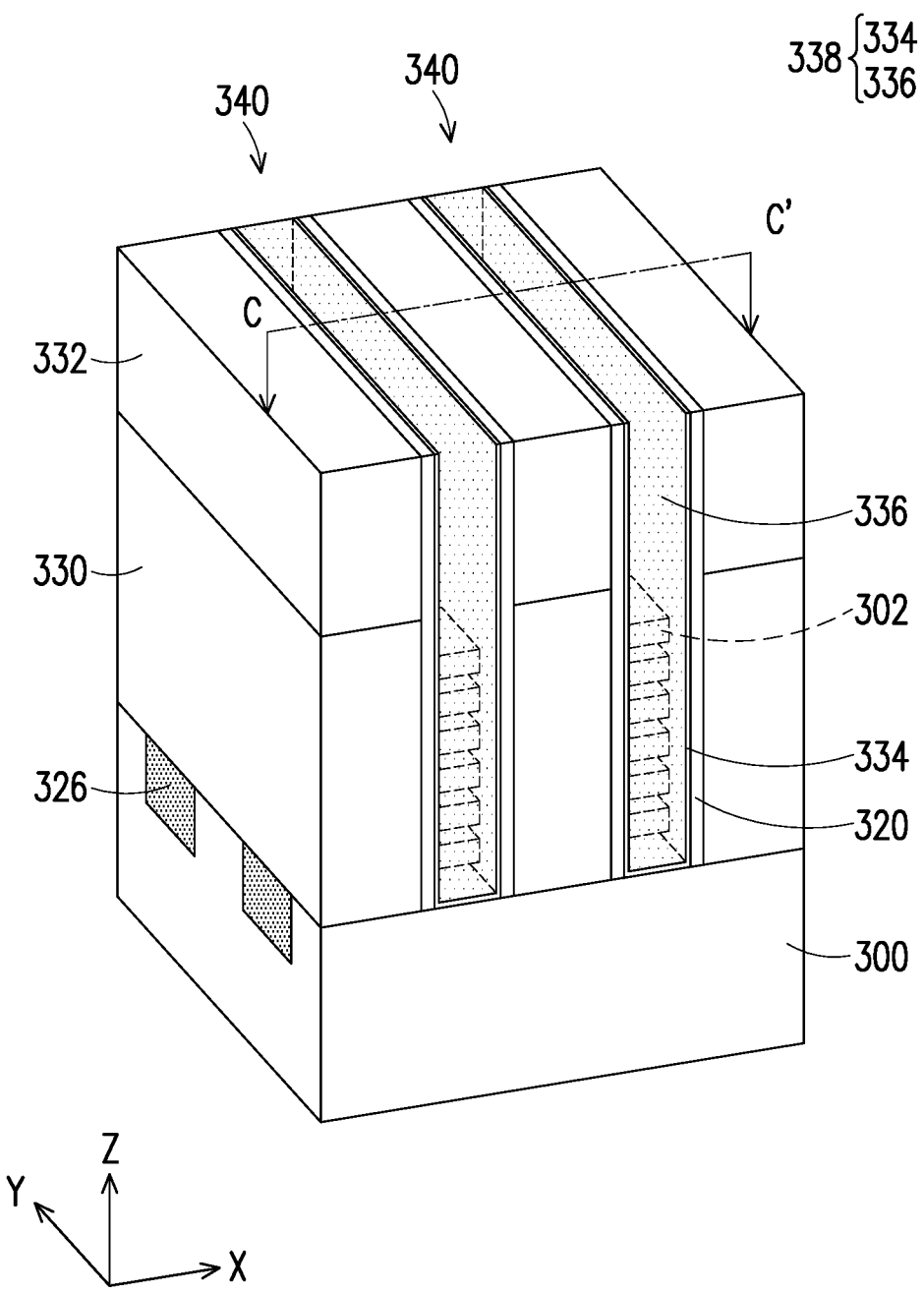
Figure 10M:
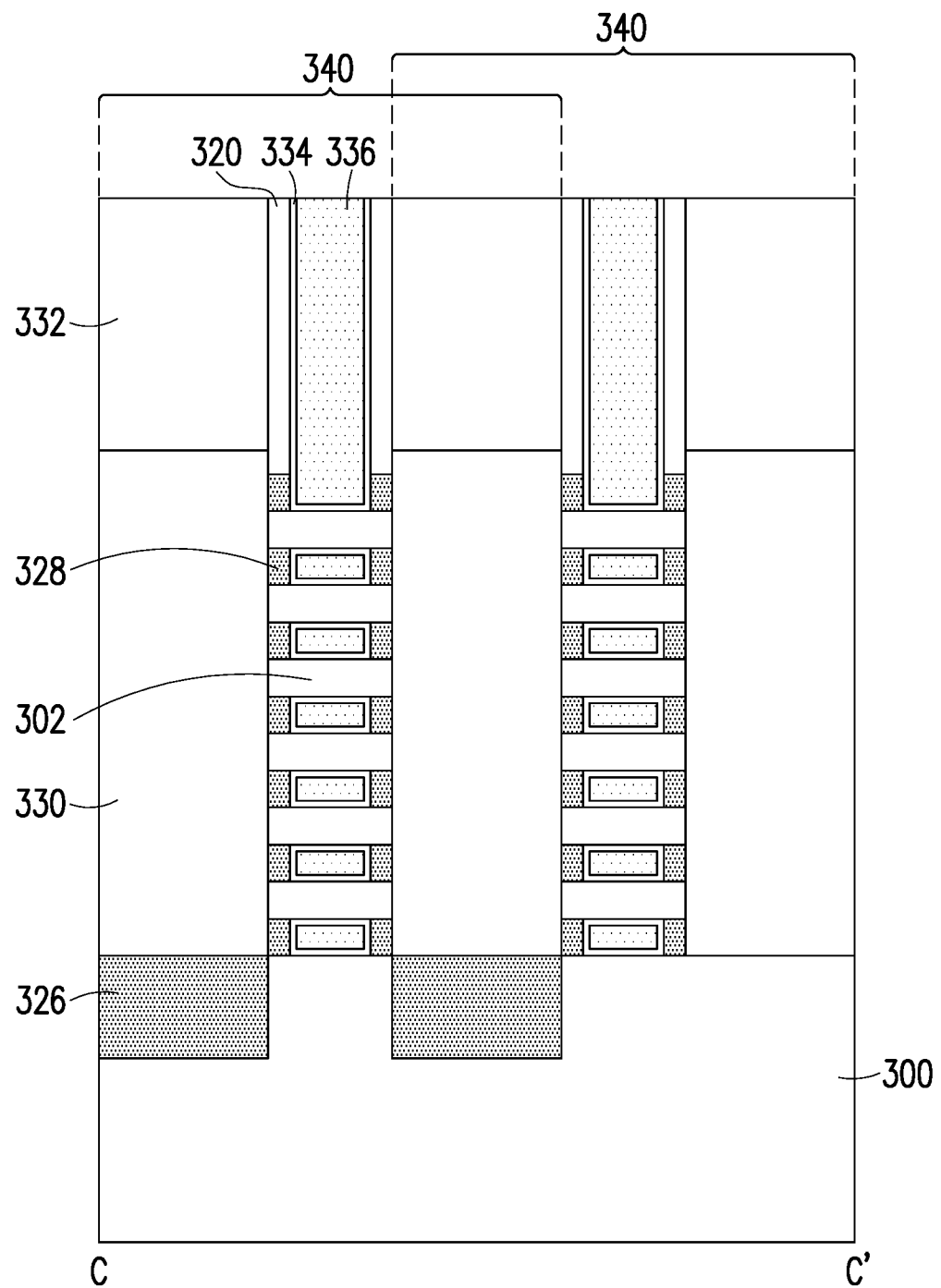
FIG. 10M is a cross-sectional view along a line C-C' shown in FIG. 10L.

The transistors to be formed (e.g., the transistor 340 as shown in FIG. 10L) could respectively be the program transistor TP, the read transistor TR or one of the sub-transistors of the selection transistor TS as described above. Particularly, the transistors overlying the embedded insulating structures could be the program transistor TP or one of the sub-transistors of the selection transistor TS as described above.

Referring to FIG. 9 and FIG. 10A, step S100 is performed, and semiconductor layers 302, sacrificial layers 304 and hard mask structures 306 are formed on a substrate 300. The substrate 300 is a semiconductor wafer or a semiconductor-on-insulator (SOI) wafer. The semiconductor layers 302 and the sacrificial layers 304 are alternately formed on the substrate 300, so as to form a stacking structure on the substrate 300. In some embodiments, the semiconductor layers 302 and the sacrificial layers 304 are made of different semiconductor materials, such that the semiconductor layers 302 could have a sufficient etching selectivity with respect to the sacrificial layers 304. For instance, the semiconductor layers 302 are made of silicon, whereas the sacrificial layers 304 are made of silicon germanium. In addition, a method for forming the semiconductor layers 302 and the sacrificial layers 304 may include epitaxial processes. On the other hand, the hard mask structures 306 are formed on the stacking structure. In some embodiments, the hard mask structures 306 are arranged along the second direction Y, and are extending along the first direction X. In addition, in some embodiments, each hard mask structure 306 includes a hard mask layer 306a and a hard mask layer 306b formed over the hard mask layer 306a. The hard mask layers 306a, 306b may be made of different insulating materials. For instance, materials of the hard mask layers 306a, 306b may be selected from a group consisting of silicon oxide, silicon nitride, silicon oxynitride and the like. A method for forming the hard mask structures 306 may include one or more deposition process (e.g., chemical vapor deposition (CVD) process) and a self-aligned multiple patterning process (e.g., a self-aligned double patterning (SADP) process or a self-aligned quadruple patterning (SAQP) process).

Referring to FIG. 9 and FIG. 10B, step S102 is performed, and the stacking structure of the semiconductor layers 302 and the sacrificial layers 304 is patterned into fin structures 308 by using the hard mask structures 306 as shadow masks. In those embodiments where the hard mask structures 306 are arranged along the second direction Y and extending along the first direction X, the formed fin structures 308 are also arranged along the second direction Y and extending along the first direction X. A method for patterning the stacking structure to form the fin structures 308 may include an etching process, such as an anisotropic etching process. The etching process may be stopped when a top surface of the substrate 300 is exposed, or a top portion of the substrate may be removed during the etching process. In some embodiments, the hard mask layers 306b of the hard mask structures 306 may be removed during the etching process.

Referring to FIG. 9 and FIG. 10C, step S104 is performed, and sacrificial gate structures 310 are formed on the substrate 300. An extending direction of the sacrificial gate structures 310 is intersected with an extending direction of the fin structures 308, and the sacrificial gate structures 310 cover portions of the fin structures 308 that are overlapped with the sacrificial gate structures 310. In those embodiments where the fin structures 308 are arranged along the second direction Y and extending along the first direction X, the sacrificial gate structures 310 may be arranged along the first direction X and extend along the second direction Y. In some embodiments, each sacrificial gate structure 310 includes a dummy gate dielectric layer 312 and a dummy gate electrode 314. The dummy gate dielectric layer 312 is conformally formed on the substrate 300 and the fin structures 308, whereas the dummy gate electrode 314 covers the dummy gate dielectric layer 312, and are formed to a height greater than a height of the fin structures 308. In some embodiments, each sacrificial gate structure 310 further includes a capping structure 316 lying on the dummy gate electrode 314. The capping structure 316 may include a capping layer 316a and a capping layer 316b lying above the capping layer 316a. In some embodiments, the capping layer 316b has rounded top corners. Materials of the dummy gate dielectric layer 312, the capping layer 316a and the capping layer 316b may respectively include silicon oxide, silicon nitride, silicon oxynitride, the like or combinations thereof, whereas a material of the dummy gate electrode 314 may include polysilicon. In addition, methods for forming the dummy gate dielectric layer 312, the capping layers 316a, 316b and the dummy gate electrode 314 may respectively include a deposition process, such as a CVD process or an atomic layer deposition (ALD) process.

Referring to FIG. 9 and FIG. 10D, step S106 is performed, and a gate spacer layer 318 is formed on the current structure. In some embodiments, the gate spacer layer 318 is globally formed over the structure as shown in FIG. 10C. In these embodiments, the substrate 300, the fin structures 308 and the sacrificial gate structures 310 may be conformally covered by the gate spacer layer 318. A material of the gate spacer layer 318 may include silicon oxide, silicon nitride, silicon carbide, silicon oxynitride, SiCN, silicon oxycarbide, SiOCN, the like or combinations thereof, and a method for forming the gate spacer layer 318 may include a deposition process, such as a CVD process or an ALD process.

Referring to FIG. 9 and FIG. 10E, step S108 is performed, and some portions of the fin structures 308 and the gate spacer layer 318 are removed. In some embodiments, portions of the gate spacer layer 318 covering the sidewalls of the sacrificial gate structures 310 are remained, and may be referred as gate spacers 320. On the other hand, other portions of the gate spacer layer 318 are removed, and portions of the fin structures 308 not covered by the sacrificial gate structures 310 and the gate spacers 320 are accordingly exposed. Thereafter, the exposed portions of the fin structures 308 are removed, whereas portions of the fin structures 308 covered by the gate spacers 320 and the sacrificial gate structures 310 are remained. In some embodiments, a method for removing these portions of the fin structures 308 and gate spacer layer 318 may include one or more etching processes, such as one or more anisotropic etching processes. In addition, the etching process may be stopped when the top surface of the substrate 300 is exposed, or a top portion of the substrate 300 is removed during the etching process(es).

Referring to FIG. 9 and FIG. 10F, step S110 is performed, and recesses 322 are formed at a top surface of the substrate 300. The recesses 322 will be filled by an insulating material to form embedded insulating structures (e.g., the embedded insulating structures 324 as shown in FIG. 10H) in the following steps. The recesses 322 are located at a single side or opposite sides of at least one of the sacrificial gate structures 310. For instance, as shown in a top view enclosed by a dash line in FIG. 10F, the recesses 322 are formed at opposite sides of one of the sacrificial gate structures 310. The recesses 322 at different sides of this sacrificial gate structure 310 are laterally spaced apart from each other by a portion of the substrate 300 lying below this sacrificial gate structure 310. In addition, the recesses 322 in the same column (along the second direction Y) may be laterally separated from each other. Alternatively, as described with reference to FIG. 2B, FIG. 2C, FIG. 3A through FIG. 3E, FIG. 5A, FIG. 7A and FIG. 7B, the recesses 322 in the same column (along the second direction Y) may otherwise be merged into a single recess. In addition, a width (along the first direction X) of the recesses 322 may be less than, substantially equal to or greater than a spacing between adjacent sacrificial gate structures 310. A method for forming the recesses 322 may include a lithography process and an etching process, such as an anisotropic etching process.

Referring to FIG. 9 and FIG. 10G, step S112 is performed, and the sacrificial layers 304 are laterally recessed from the semiconductor layers 302 and the gate spacers 320. As such, recesses 324 are formed at sidewalls of the remained portions of the fin structures 308. In some embodiments, the sacrificial layers 304 are laterally recessed from the semiconductor layers 302 and the gate spacers 320 by a distance ranging from 0.5 nm to 1 nm. A method for lateral recessing the sacrificial layers 304 may include an etching process, such as an isotropic etching process. By properly selecting etchants for the etching process and/or by properly selecting the materials of the sacrificial layers 304 and the semiconductor layers 302, the sacrificial layers 304 can be etched without consuming the semiconductor layers 302 and other components in the current structure.

Referring to FIG. 9 and FIG. 10H, step S114 is performed, and an insulating material is filled in the recesses 322 at the top surface of the substrate 300 and the recesses 324 at the sidewalls of the fin structures 308. Portions of the insulating material filled in the recesses 322 form embedded insulating structures 326, whereas portions of the insulating material filled in the recesses 324 form inner spacers 328. Top surfaces of the embedded insulating structures 326 may be recessed from, coplanar with or protruded from a top surface of the substrate 300. On the other hand, in some embodiments, exposed surfaces of the inner spacers 328 are substantially coplanar with exposed surfaces of the semiconductor layers 302 and sidewalls of the gate spacers 320. In alternative embodiments, the exposed surfaces of the inner spacers 328 are dented from the exposed surfaces of the semiconductor layers 302 and the sidewalls of the gate spacers 320. A material of the insulating material for forming the embedded insulating structures 326 and the inner spacers 328 may include silicon oxide, silicon nitride, silicon carbide, silicon carbide nitride, silicon oxide carbide, silicon carbide oxynitride, or other suitable dielectric materials or combinations thereof. A method for forming the inner spacers 328 may include initially forming a material layer globally covering the structure shown in FIG. 10G, and then removing portions of this blanket layer outside the recesses 322, 324. In this way, the remained portions of this material layer form the embedded insulating structures 326 and the inner spacers 328. In some embodiments, the material layer is formed by using a deposition process (e.g., a CVD process or an ALD process), and the portions of the material layer are removed by using an etching process (e.g., an anisotropic etching process).

Referring to FIG. 9 and FIG. 10I, step S116 is performed, and source/drain electrodes 330 are formed on the substrate 300. The sacrificial gate structures 310 are respectively located between a pair of the source/drain electrodes 330, and are separated from the source/drain electrodes 330 by the gate spacers 318. In addition, the semiconductor layers 302 and the inner spacers 328 covered by each sacrificial gate structure 310 are in lateral contact with a pair of the source/drain electrodes 330, and the embedded insulating structures 326 are covered by at least some of the source/drain electrodes 330. A material of the source/drain electrodes 330 may include silicon, silicon germanium, silicon carbide or the like. In some embodiments, the source/drain electrodes 330 are formed by an epitaxial process. In these embodiments, the source/drain electrodes 330 may be grown from the semiconductor layers 302 and the exposed portions of the substrate 300. Even though the source/drain electrodes 330 are depicted as rectangular cuboids, the source/drain electrodes 330 may be actually formed as other shapes, the present disclosure is not limited to the shapes of the source/drain electrodes 330.

Referring to FIG. 9 and FIG. 10J, step S118 is performed, such that a dielectric layer 332 is formed on the current structure, and the sacrificial gate structures 310 are removed. In some embodiments, the dielectric layer 332 may initially cover the whole structure shown in FIG. 10I, and then a planarization process may be performed to remove a top portion of the dielectric layer 332, and to expose the sacrificial gate structures 310. In certain cases, top portions of the sacrificial gate structures 310 may also be removed during the planarization process. For instance, the planarization process may include a chemical mechanical polishing (CMP) process, an etching process or a combination thereof. After the sacrificial gate structures 310 are exposed, the remainder portion of the sacrificial gate structures 310 are removed, and cavities respectively defined between adjacent gate spacers 320 are formed. The semiconductor layers 302 and the sacrificial layers 304 previously covered by the sacrificial gate structures 310 are currently exposed in the cavities. A material of the dielectric layer 332 may include tetraethylorthosilicate (TEOS) oxide, un-doped silicate glass, or doped silicon oxide (e.g., borophosphosilicate glass (BPSG), fused silica glass (FSG), phosphosilicate glass (PSG), boron doped silicon glass (BSG)), other suitable dielectric materials or combinations thereof, and a method for forming the dielectric layer 332 may include a deposition process, such as a CVD process. In addition, the sacrificial gate structures 310 may be removed by an etching process, such as an isotropic etching process.

In some embodiments, a contact etching stop layer (CESL) (not shown) may be formed on the structure shown in FIG. 10I before forming the dielectric layer 332. Initially, the CESL layer may conformally cover the source/drain electrodes 330 and the sacrificial gate structures 310. Thereafter, a top portion of the CESL layer covering the sacrificial gate structures 310 may be removed along with the top portion of the dielectric layer 332 during the planarization process. A material of the CESL layer may include silicon nitride, silicon oxynitride, silicon nitride with oxygen or carbon elements, the like or combinations thereof, and a method for forming the CESL layer may include a deposition process, such as a CVD process or an ALD process.

Referring to FIG. 9 and FIG. 10K, step S120 is performed, and the sacrificial layers 304 are removed. As such, the semiconductor layers 302 are released in the cavities respectively defined between adjacent gate spacers 320. The released semiconductor layers 302 could be the channel structures 110 as described with reference to FIG. 2C. In addition, inner sidewalls of the inner spacers 328 previously covered by the sacrificial layers 304 are currently exposed in the cavities. In some embodiments, a method for removing the sacrificial layers 304 may include an etching process, such as an isotropic etching process. By properly selecting etchants for the etching process and/or properly selecting the materials of the sacrificial layers 304 and the semiconductor layers 302, the sacrificial layers 304 can be etched without removing the semiconductor layers 302 and other components in the current structure.

Referring to FIG. 9, FIG. 10L and FIG. 10M, step S122 is performed, and gate dielectric layers 334 and gate electrodes 336 are formed in the cavities respectively defined between adjacent gate spacers 320. The gate dielectric layers 334 and the gate electrodes 336 may be collectively referred as gate structures 338, and the previously shown sacrificial gate structures 310 may be regarded as being replaced by the gate structures 338. In addition, structures including the gate structures 338, the inner spacers 328 and the gate spacers 320 could be the gate structures 102, 202 as described with reference to FIG. 2A through FIG. 2C, FIG. 3A through FIG. 3E, FIG. 4, FIG. 5A, FIG. 5B, FIG. 7A, FIG. 7B and FIG. 8. As shown in FIG. 10L and FIG. 10M, the gate dielectric layers 334 are respectively lining on the exposed surfaces of the semiconductor layers 302, the substrate 300, the inner spacers 328 and the gate spacers 320 in one of the cavities defined between adjacent gate spacers 320. The gate electrodes 336 fill the remainder space in these cavities. A material of the gate dielectric layer 334 may include a high-k dielectric material. Examples of the high-k dielectric material may include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. A material of the gate electrodes 336 may include polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In addition, a method for forming the gate dielectric layers 334 may include a deposition process, such as a CVD process or an ALD process, whereas a method for forming the gate electrodes 336 may include a deposition process (e.g., a CVD process or an ALD process), a plating process (e.g., an electrical plating process or an electroless plating process) or a combination thereof.

In some embodiments, one or more work function layer (not shown, such as the work function layer 114 as described with reference to FIG. 2C) is formed between each gate dielectric layer 332 and the overlying gate electrode 336. In addition, in some embodiments, interfacial layers (not shown) may be formed on the exposed surfaces of the semiconductor layers 302 before forming the gate dielectric layers 334. Those skilled in the art may select proper materials and formation methods for the work function layers and the interfacial layers according to process requirements, the present disclosure is not limited thereto.

Up to here, transistors 340 are formed. The transistors 340 respectively include one of the gate structures 338, the semiconductor layers 302 in this gate structure 338, and a pair of source/drain electrodes 330 at opposite sides of this gate structure 336. In addition, the embedded insulating structures 326 are lying under the source/drain electrodes 330 of some of the transistors 340 (e.g., the left one of the transistors 340 as shown in FIG. 10L). The transistor 340 covering the embedded insulating structures 326 could be the program transistor TP as described with reference to FIG. 2A through FIG. 2D, FIG. 3A through FIG. 3E, FIG. 4, FIG. 5A and FIG. 5B, or could be one of the sub-transistors of the selection transistor TS as described with reference to FIG. 7A, FIG. 7B and FIG. 8. On the other hand, the transistor 340, of which at least one of the source/drain electrodes 330 is not overlapped with the embedded insulating structures 326, could be the read transistor TP as described with reference to FIG. 2A through FIG. 2D, FIG. 3A through FIG. 3E, FIG. 4, FIG. 5A and FIG. 5B.

Thereafter, an interconnection structure (not shown) may be formed over the structure shown in FIG. 10L. The interconnection structure may include a stack of dielectric layers and interconnections formed in the stack of dielectric layers. The interconnections are electrically connected to the transistors 340. In some embodiments, the fuse resistors FR as described with reference to FIG. 7A, FIG. 7B and FIG. 8 are formed in the interconnection structure, and may be at a height the same as a height of a layer of the interconnections. The fuse resistors FR and the interconnections may be made of the same conductive material, and the fuse resistors FR and a layer of the interconnections may be formed simultaneously. Alternatively, the fuse resistors FR and the interconnections may be made of different conductive materials, and the fuse resistors FR and the layer of the interconnections at the same height may be formed in different processes.

As above, the memory device according to embodiments of the present disclosure may be an OTP memory device. The memory device includes multiple memory cells. Each memory cell includes a transistor and an OTP device electrically coupled to the transistor, and includes embedded insulating structures lying under the OTP device and/or the transistor. In some embodiments, the OTP device is an antifuse component, such as a transistor (hereinafter, an OTP transistor). In these embodiments, the embedded insulating structures are lying under source and drain electrodes of the OTP transistors, and leakage paths along which gate leakage out spreading from below the gate electrodes of the OTP transistors can be cut off. As a result, voltage drop along the word line used for programming the selected memory cell can be reduced, thus a program voltage of the memory device can be lowered, and the memory device can be more compatible with other integrated circuits. In alternative embodiments, the OTP device is a fuse resistor, and the embedded insulating structures are disposed in a substrate on which the transistor and the fuse resistor are disposed. In these alternative embodiments, heat dissipation ability of the substrate is reduced, and heat can be more centralized at the fuse resistor during a programming operation. Therefore, a program voltage of the memory device can be lowered as well, and the memory device can also be more compatible with other integrated circuits.

In an aspect of the present disclosure, a memory device is provided. The memory device comprises: a transistor, formed on a substrate, and comprising a gate structure, channel structures, a source electrode and a drain electrode, wherein the source and drain electrodes are located at opposite sides of the gate structure, the channel structures penetrate through the gate structure, and are in contact with the source and drain electrodes; and a first embedded insulating structure and a second embedded insulating structure, disposed in the substrate and overlapped with the source and drain electrodes of the transistor, wherein the first embedded insulating structure is laterally spaced apart from the second embedded insulating structure by a portion of the substrate lying under the gate structure.

In another aspect of the present disclosure, a memory device is provided. The memory device comprises: a first transistor, formed on a substrate, and comprising a gate structure, a source electrode and a drain electrode, wherein the source and drain electrodes are located at opposite sides of the gate structure; an embedded insulating structure, formed in the substrate, and overlapped with the source electrode or the drain electrode of the first transistor, wherein the embedded insulating structure at one side of the gate structure does not extend to an opposite side of the gate structure; and an one-time-programmable device, formed on the substrate and electrically coupled to the source electrode or the drain electrode of the first transistor.

In yet another aspect of the present disclosure, a manufacturing method of a memory device is provided. The method comprises: forming a stacking structure on a substrate, wherein the stacking structure is extending along a first direction, and the stacking structure comprises semiconductor layers and sacrificial layers alternately stacked on the substrate; forming a sacrificial gate structure on the substrate, wherein the sacrificial gate structure is extending along a second direction intersected with the first direction, and covers a portion of the stacking structure; removing portions of the stacking structure not overlapped with the sacrificial gate structure; forming at least one recess at an exposed surface of the substrate, wherein the at least one recess is located at one or both of opposite sides of the sacrificial gate structure; filling an insulating material into the at least one recess to form at least one embedded insulating structure; forming a source electrode and a second electrode at the opposite sides of the sacrificial gate structure, wherein the semiconductor layers in the remained stacking structure are connecting between the source and drain electrodes, and at least one of the source and drain electrodes is overlapped with the at least one embedded insulating structure; and replacing the sacrificial gate structure by a gate structure and removing the sacrificial layers.

It should be appreciated that the following embodiment(s) of the present disclosure provides applicable concepts that can be embodied in a wide variety of specific contexts. The embodiments are intended to provide further explanations but are not used to limit the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first transistor, formed on a substrate, and comprising a gate structure, a source electrode and a drain electrode, wherein the source and drain electrodes are located at opposite sides of the gate structure;
an embedded insulating structure, formed in the substrate, and overlapped with the source electrode or the drain electrode of the first transistor, wherein the embedded insulating structure at one side of the gate structure does not extend to an opposite side of the gate structure; and
an one-time-programmable device, formed on the substrate and electrically coupled to the source electrode or the drain electrode of the first transistor,
wherein the gate structure formed in a wall shape has a width direction and a length direction, the embedded insulating structure comprises a first embedded insulating structure laterally spaced apart from a second embedded insulating structure, the second embedded insulating structure is overlapped with the one of the source electrode and the drain electrode of the first transistor, and the source electrode is laterally spaced apart from the drain electrode along the width direction of the gate structure, and the source and drain electrodes, as well as the embedded insulating structure, extend along the length direction of the gate structure.

2. The memory device according to claim 1, wherein the one-time-programmable device is a second transistor, the source electrode or the drain electrode of the first transistor is shared by the first and second transistors.

3. The memory device according to claim 2, wherein the second transistor has another source or drain electrode overlapped with the first embedded insulating structure.

4. The memory device according to claim 1, wherein the one-time-programmable device is a fuse resistor, and the fuse resistor is electrically coupled to the source electrode or the drain electrode of the first transistor.

5. The memory device according to claim 4, wherein the fuse resistor is formed in an interconnection structure lying above the first transistor.

6. The memory device according to claim 5, wherein the fuse resistor is laterally spaced apart from the first transistor.

7. A memory device, comprising:
a transistor, formed on a substrate, and comprising a gate structure, channel structures, a source electrode and a drain electrode, wherein the source and drain electrodes are located at opposite sides of the gate structure, the channel structures penetrate through the gate structure, and are in contact with the source and drain electrodes; and
a first embedded insulating structure and a second embedded insulating structure, disposed in the substrate and overlapped with the source and drain electrodes of the transistor, wherein the first embedded insulating structure is laterally spaced apart from the second embedded insulating structure by a portion of the substrate lying under the gate structure, wherein the gate structure formed in a wall shape has a width direction and a length direction, the channel structures extend along the width direction of the gate structure, the source and drain electrodes as well as the first and second embedded insulating structures extend along the length direction of the gate structure, and the first embedded insulating structure is laterally spaced apart from the second embedded insulating structure along the width direction of the gate structure.

8. The memory device according to claim 7, wherein the first and second embedded insulating structures respectively comprise a first insulating layer and a second insulating layer formed on the first insulating layer.

9. The memory device according to claim 7, wherein substantially the entire source and drain electrodes are overlapped with the first and second embedded insulating structures.

10. The memory device according to claim 7, wherein the first and second embedded insulating structures extend into the substrate from a top surface of the substrate.

11. The memory device according to claim 7, wherein the source and drain electrodes respectively have a first portion and a second portion, the second portions are laterally spaced apart from the gate structure at least by the first portions, and at least one of the second portions is not overlapped with the first embedded insulating structure nor the second embedded insulating structure.

12. The memory device according to claim 11, wherein both of the second portions are not overlapped with the first embedded insulating structure nor the second embedded insulating structure.

13. The memory device according to claim 7, wherein the first and second embedded insulating structures respectively have a plurality of sub-structures laterally spaced apart from one another along a direction intersected with an extending direction of the channel structures.

14. The memory device according to claim 13, wherein the source and drain electrodes respectively have a first portion and a second portion, the second portions are laterally spaced apart from the gate structure at least by the first portions, and at least one of the second portions is not overlapped with the first embedded insulating structure nor the second embedded insulating structure.

15. The memory device according to claim 13, wherein portions of the source and drain electrodes overlapped with the first and second embedded insulating structures spread from near ends of the source and drain electrodes to far ends of the source and drain electrodes, the near ends face toward the gate structure, and the far ends face away from the gate structure.

16. The memory device according to claim 13, wherein at least one of the first and second embedded insulating structures is overlapped with the channel structures along a vertical direction.

17. A memory device, comprising:
a stack of channel structures, formed on a semiconductor substrate, and vertically separated from one another;
a gate line, intersecting with and wrapping around the channel structures;
a pair of source/drain electrodes, disposed on the semiconductor substrate and located at opposite sides of the gate line, wherein the channel structures extend between the source/drain electrodes; and
a first embedded insulating structure and a second embedded insulating structure, formed in a recess at a top surface of the semiconductor substrate, and respectively overlapped with one of the source/drain electrodes, wherein a portion of the semiconductor substrate extending along and overlapped with the gate line is in lateral contact with the first and second embedded insulating structures,
wherein the gate line formed in a wall shape has a width direction and a length direction, the channel structures extend through the gate line along the width direction of the gate line, the source and drain electrodes, as well as the first and second embedded insulating structures, extend along the length direction of the gate line.

18. The memory device according to claim 17, wherein the second embedded insulating structure is laterally spaced apart from the first embedded insulating structure by the portion of the semiconductor substrate.

19. The memory device according to claim 17, wherein the first and second embedded insulating structures are in contact with the source/drain electrodes from below the source/drain electrodes.

20. The memory device according to claim 17, further comprising an one-time programmable device coupled to one of the source/drain electrodes.

* * * * *